US012666733B2

(12) United States Patent
Tsai et al.

(10) Patent No.: US 12,666,733 B2
(45) Date of Patent: Jun. 23, 2026

(54) HIGH ASPECT RATIO BACK SIDE DEEP TRENCH ISOLATON STRUCTURE WITH SUBSTRATE-EMBEDDED METAL GRID AND NO PINCH OFF

(71) Applicant: Taiwan Semiconductor Manufacturing Company, Ltd., Hsinchu (TW)

(72) Inventors: Tsung Hsien Tsai, Hsinchu (TW); Cheng Yu Huang, Hsinchu (TW); Jen-Cheng Liu, Hsin-Chu City (TW); Keng-Yu Chou, Kaohsiung City (TW); Ming-En Chen, Tainan City (TW); Shyh-Fann Ting, Tainan City (TW)

(73) Assignee: Taiwan Semiconductor Manuffacturing Company, Ltd., Hsinchu (TW)

( * ) Notice: Subject to any disclaimer, the term of this patent is extended or adjusted under 35 U.S.C. 154(b) by 602 days.

(21) Appl. No.: 18/155,096

(22) Filed: Jan. 17, 2023

(65) Prior Publication Data

US 2024/0243156 A1     Jul. 18, 2024

(51) Int. Cl.
H10F 39/12 (2025.01)
H10F 39/00 (2025.01)

(52) U.S. Cl.
CPC ......... H10F 39/199 (2025.01); H10F 39/024 (2025.01); H10F 39/811 (2025.01)

(58) Field of Classification Search
CPC ............................. H10F 39/199; H10F 39/807
See application file for complete search history.

(56) References Cited

U.S. PATENT DOCUMENTS

| | | | | |
|---|---|---|---|---|
| 10,510,788 | B2 * | 12/2019 | Chou | H10F 39/8067 |
| 10,535,698 | B2 * | 1/2020 | Cheng | H10F 39/807 |
| 11,031,434 | B2 * | 6/2021 | Tsao | H10F 39/807 |
| 11,177,309 | B2 * | 11/2021 | Cheng | H10F 39/011 |
| 11,776,985 | B2 * | 10/2023 | Tsao | H10F 39/024 |
| | | | | 257/435 |
| 12,218,166 | B2 * | 2/2025 | Kao | H10F 39/811 |
| 12,317,613 | B2 * | 5/2025 | Tsao | H10F 39/8053 |
| 2019/0131327 | A1 * | 5/2019 | Chou | H10F 39/8067 |
| 2019/0165029 | A1 * | 5/2019 | Cheng | H10F 39/811 |

(Continued)

FOREIGN PATENT DOCUMENTS

CN          111029357 A       4/2020

*Primary Examiner* — Mounir S Amer
*Assistant Examiner* — Alexander Belousov
(74) *Attorney, Agent, or Firm* — Eschweiler & Potashnik, LLC

(57) ABSTRACT

A process of forming a back side deep trench isolation structure for an image sensing device includes etching first trenches in the back side of a semiconductor substrate, lining the first trenches with dielectric, depositing passivation layers over and within the first trenches, and etching second trenches through the passivation layers into the first trenches, and filling the second trenches to form a substrate-embedded metal grid. Optionally, the bottoms of the first trenches are filled by depositing and etching a lower fill material prior to depositing the passivation layers. The method prevents the passivation layers from pinching off in a way that causes voids within the first trenches. The result is better optical performance such as increased quantum efficiency and reduced crosstalk.

20 Claims, 28 Drawing Sheets

(56)        References Cited

U.S. PATENT DOCUMENTS

| 2020/0135798 | A1* | 4/2020 | Tsao | H10F 39/8057 |
| 2020/0152687 | A1* | 5/2020 | Cheng | H10F 39/199 |
| 2021/0280630 | A1* | 9/2021 | Tsao | H10F 39/8057 |
| 2022/0336505 | A1* | 10/2022 | Kao | H10F 39/807 |
| 2024/0021653 | A1* | 1/2024 | Tsao | H10F 39/8063 |
| 2024/0243156 | A1* | 7/2024 | Tsai | H10F 39/8053 |
| 2024/0379710 | A1* | 11/2024 | Kao | H10F 39/807 |
| 2025/0275263 | A1* | 8/2025 | Tsao | H10F 39/8053 |

* cited by examiner

1100

901

101

175
129
128
131

126

107

108

122
123

1200

138
137
101

181
175
129
128
131

126

107

108

122
123

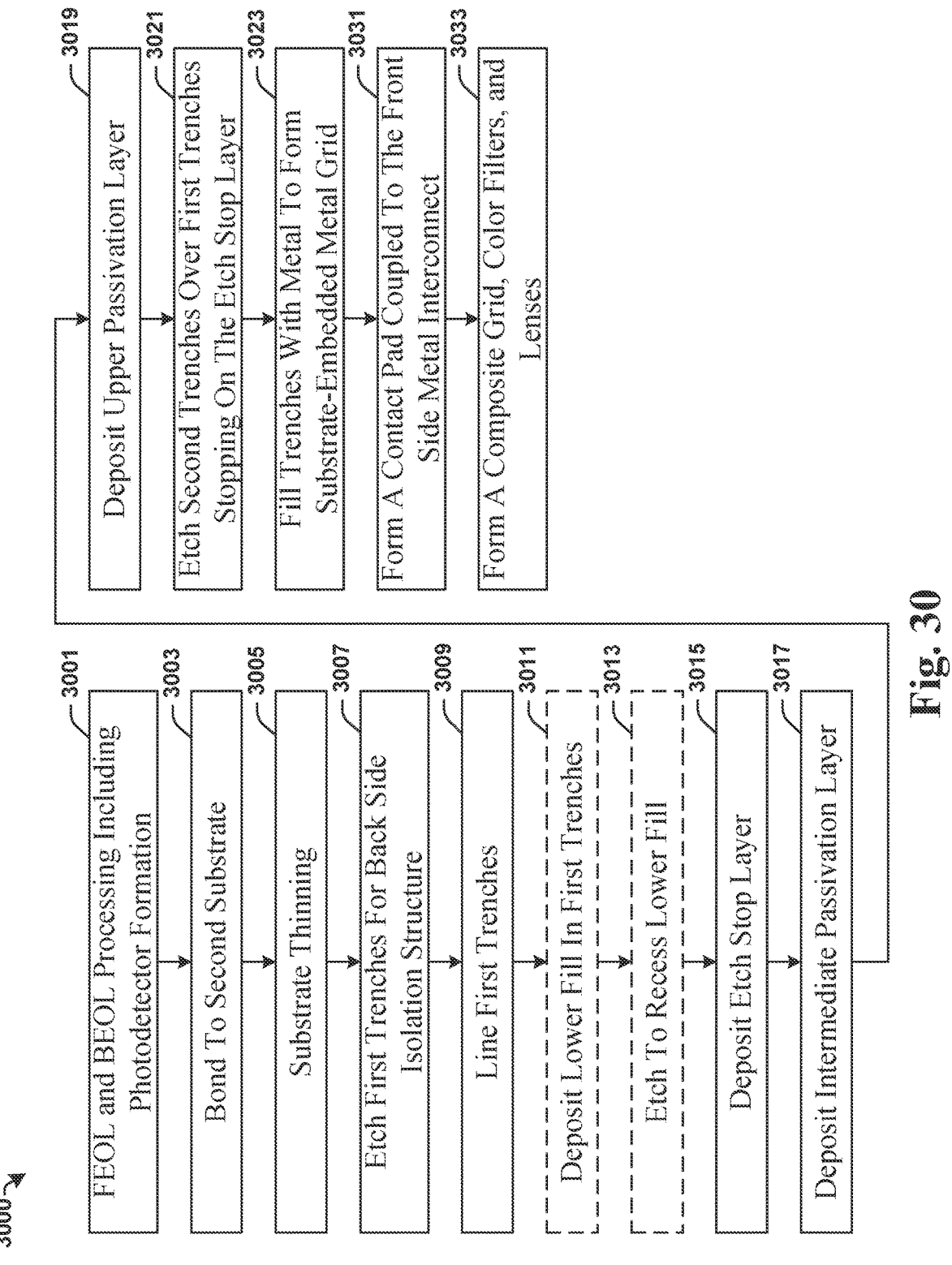

3000

3001 FEOL and BEOL Processing Including Photodetector Formation

3003 Bond To Second Substrate

3005 Substrate Thinning

3007 Etch First Trenches For Back Side Isolation Structure

3009 Line First Trenches

3011 Deposit Lower Fill In First Trenches

3013 Etch To Recess Lower Fill

3015 Deposit Etch Stop Layer

3017 Deposit Intermediate Passivation Layer

3019 Deposit Upper Passivation Layer

3021 Etch Second Trenches Over First Trenches Stopping On The Etch Stop Layer

3023 Fill Trenches With Metal To Form Substrate-Embedded Metal Grid

3031 Form A Contact Pad Coupled To The Front Side Metal Interconnect

3033 Form A Composite Grid, Color Filters, and Lenses

Fig. 30

HIGH ASPECT RATIO BACK SIDE DEEP TRENCH ISOLATON STRUCTURE WITH SUBSTRATE-EMBEDDED METAL GRID AND NO PINCH OFF

BACKGROUND

Integrated circuits (IC) comprising image sensors are used in a wide range of modern-day electronic devices such as cameras and cell phones. Complementary metal-oxide semiconductor (CMOS) devices have become popular IC image sensors. Compared to charge-coupled devices (CCD), CMOS image sensors (CIS) are increasingly favored due to low power consumption, small pixel size, fast data processing, and low manufacturing cost. As the pixel sizes are made increasingly smaller, manufacturing becomes increasingly difficult as does limiting crosstalk between pixels. These are ongoing challenges where unique solutions can provide improved performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 30 is a flow chart of a manufacturing process according to some aspects of the present disclosure.

DETAILED DESCRIPTION

Figure 1A:
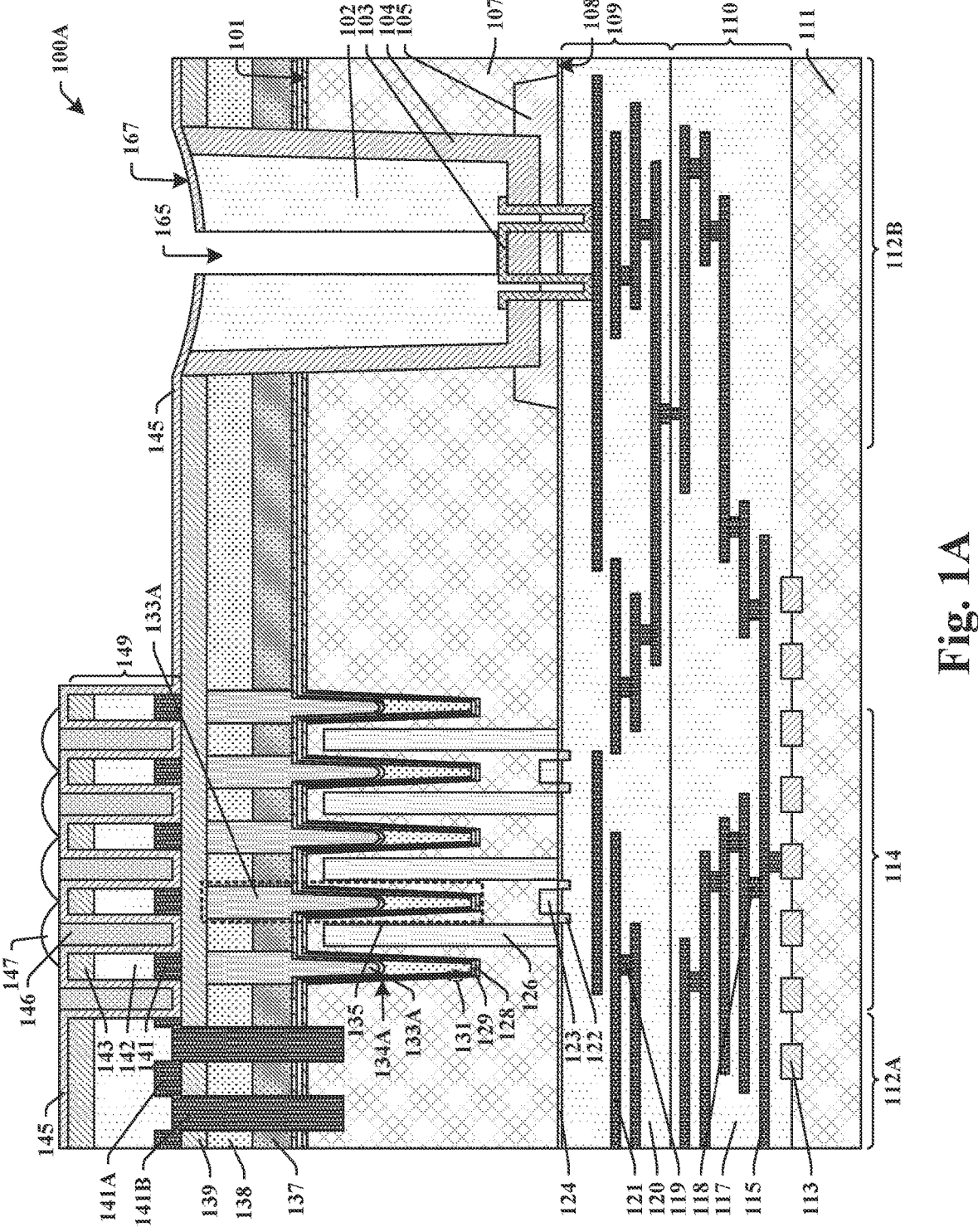
FIG. 1A illustrates a cross-sectional side view of an IC device according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors designed for back side illumination (BSI) are integrated circuit devices (ICs) that include an array of photodetectors within a semiconductor substrate. The photodetectors may be separated by a back side deep trench isolation (BDTI) structure, which is an isolation structure that extends into the semiconductor substrate from its back side. There may be passivation layers on the back side. The passivation layers may include an upper passivation layer and an intermediate passivation layer between the upper passivation layer and the semiconductor substrate. The intermediate passivation layer is a transparent material having a refractive index between that of the upper passivation layer and that of the semiconductor substrate. The upper passivation layer is often silicon dioxide ($SiO_2$) or the like. The intermediate passivation layer may be, for example, tantalum pentoxide ($Ta_2O_5$) or the like.

The BDTI structure may includes square-shaped or ring-shaped elements that laterally surround and separate the photodetectors. The BDTI structure is formed by etching trenches in the back side of the semiconductor substrate and lining the trenches with a dielectric material. The passivation layers are subsequently deposited. A non-conformal deposition process may be used to decrease the extent to which the passivation layers deposit within the trenches. The trenches may subsequently be filled with a material that provides optical and electrical isolation between adjacent photodetectors. In some embodiments, the trenches are filled with metal to form a metal grid. In some embodiments, a negative bias voltage is applied to the metal grid to reduce crosstalk.

As the photodetector pitch is made smaller the BDTI structure takes up a progressively larger proportion of the image sensing area. This tendency may be offset by making the isolation structure narrower. The extent to which the BDTI structure may be made narrower is normally limited by a tendency of the passivation layers to pinch off at the tops of the trenches which eventually leads to the trenches closing off at the top while voids remain within. A BDTI structure with voids is generally inferior to one without voids in terms of the resulting optical performance characteristics.

In accordance with some aspects of the present disclosure, a narrower BDTI structure without voids may be achieved using a second mask and etch in the pattern of the BDTI trench structure. The second mask and etch forms second trenches. The second trenches penetrate through the passivation layers directly over the areas where the first trenches were formed. The second trenches extend into the first trenches. In some embodiments, etching the second trenches removes portions of the passivation layers that deposited in the first trenches. In some embodiments, an etch stop layer is deposited immediately before the passivation layers in order to facilitate controlling an endpoint for etching the second trenches. The second trenches are filled with metal to form a substrate-embedded metal grid.

In some embodiments, a reticle that is used to pattern a first mask used to define the first trenches is used again to pattern a second mask used to define the second trenches. In some embodiments, the second trenches are wider than the first trenches. In some embodiments, the second trenches have the same widths as the first trenches. In some embodiments, the second trenches are narrower than the first trenches. The trench widths may be controlled by varying the patterning conditions, e.g., by varying photoresist exposure time. Making the second trenches wider facilitates filling the trenches without creating voids. Making the second trenches narrower improves quantum efficiency.

In some embodiments, further narrowing of the BDTI structure is enabled by filling a bottom portion of the first trenches with a lower fill material before forming the passivation layers. Filling the bottom portion of the first trenches in this way allows an aspect ratio of the substrate-embedded metal grid to be kept constant even as the first trenches are made deeper or narrower. In some embodiments, filling the bottom portion of the first trenches with a lower fill material comprises depositing the lower fill material in the first trenches followed by an etch process that causes the lower fill material to be recessed in the trenches. In some embodiments, the lower fill material is a non-metal material. The etch stop layer may be deposited after depositing and recessing the lower fill material.

An image sensor formed by a method of the present disclosure may have superior quantum efficiency and distinctive structural features. One such feature is that the substrate-embedded metal grid cuts through the passivation layers. Although the passivation layers may be formed by a non-conformal deposition process whereby the passivation layers deposit only very thinly within the first trenches, it is inevitable that at least thin coatings of the passivation layers deposit within the first trenches. Accordingly, the passivation layers are ordinarily continuous down the sides of the metal grid and beneath the substrate-embedded metal grid. A second trench etch according to the present disclosure penetrates the passivation layers and may remove the passivation layers entirely from the first trenches. When the substrate-embedded metal grid is formed, it fills the second trenches and extends into the semiconductor substrate below the passivation layers, whereby the metal grid penetrates through the passivation layers.

In some embodiments, a distinctive feature of the BDTI structure is that it has a metal core that undergoes a step-change in width. The step change in width occurs above the back side of the semiconductor substrate. In some embodiments, the step change in width occurs below the base of the intermediate passivation layer and above the back side of the semiconductor substrate.

In some embodiments, a distinctive feature of the BDTI structure is that it has a core that includes a lower grid directly beneath the substrate-embedded metal grid. In some embodiments, the substrate-embedded metal grid and the lower grid are separated by the etch stop layer. In some embodiments, the lower grid is entirely below the back side of the semiconductor substrate. The sides and bottom of the lower grid may be separated from the semiconductor substrate by the trench-lining dielectrics. In some embodiments, the lower grid is encapsulated by the trench-lining dielectrics and the etch stop layer, or the trench lining dielectrics and the metal grid if the etch stop layer is omitted.

FIG. 1A illustrates a cross-section of an IC device 100A which is an image sensor according to some aspects of the present disclosure. The IC device 100A includes a first semiconductor substrate 107 having a front side 108, a back side 101, an image sensing area 114, a peripheral area 112A, and a peripheral area 112B. Photodetectors 126 may be disposed in the image sensing area 114 and a contact pad 103 may be disposed in the peripheral area 112B.

The photodetectors 126 may comprise photodiodes or the like formed within the first semiconductor substrate 107. Floating diffusion regions 123 may be coupled to the photodetectors 126 through transfer gates 122. There may be one floating diffusion region 123 for each photodetector 126. Alternatively, each floating diffusion region 123 may serve two or four adjacent photodetectors 126. Certain transistors may be associated with the photodetector 126. Transfer gates 122 are illustrated. Other transistors that may be associated with the photodetectors 126 include select gates, reset gates, and the like.

Micro-lenses 147 may be disposed directly above the photodetectors 126. As light travels from micro-lenses 147 to the photodetectors 126, it passes through color filters 146, an upper passivation layer 138, and an intermediate passivation layer 137. The upper passivation layer 138 and the intermediate passivation layer 137 suppress reflections. A composite grid 149 at the height of the color filters helps divide light among the photodetectors 126.

A BDTI structure 134A disposed directly below the composite grid 149 includes segments 135 that extend from the back side 101 into the first semiconductor substrate 107 between adjacent photodetectors 126. The BDTI structure 134A includes a substrate-embedded metal grid 133A. The term "substrate-embedded" is used to emphasize a distinction with a back side metal grid 141 that is part of a composite grid 149 that is entirely above the back side 101 of first semiconductor substrate 107. In some embodiments, the substrate-embedded metal grid 133A is allowed to float, which simplifies processing. In some embodiments, the substrate-embedded metal grid 133A is grounded or connected to a voltage source to provide a bias voltage.

Figure 1B:
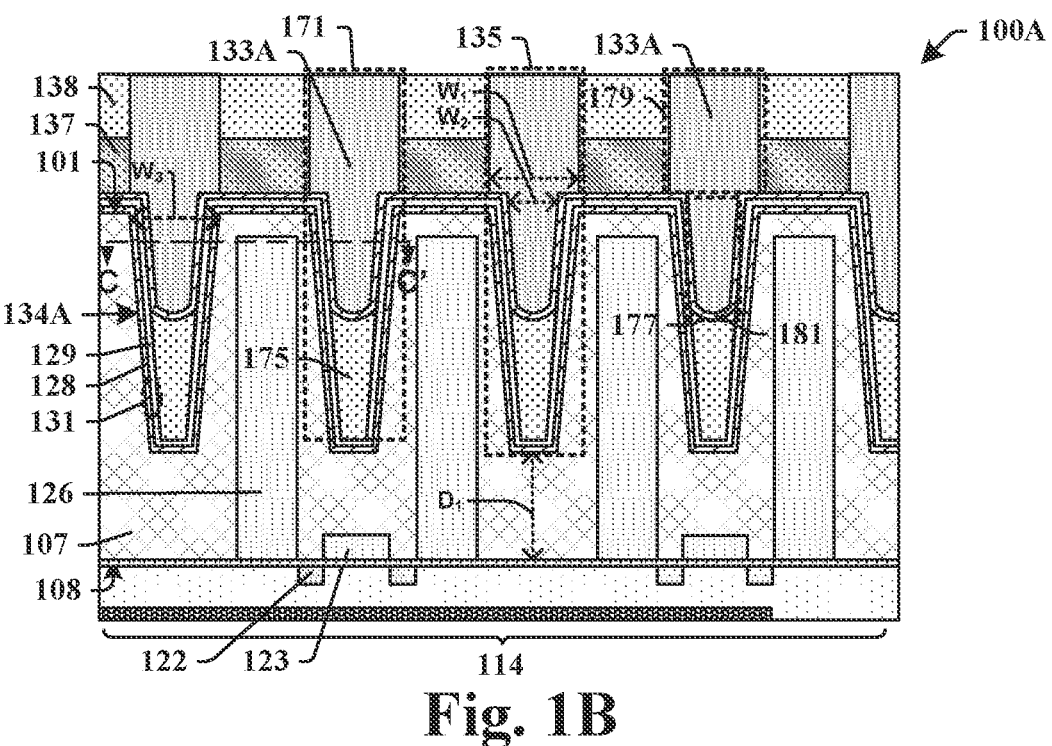
FIG. 1B provides an enlarged view of a portion of FIG. 1A that includes a back side deep trench isolation (BDTI) structure.
Figure 1C:
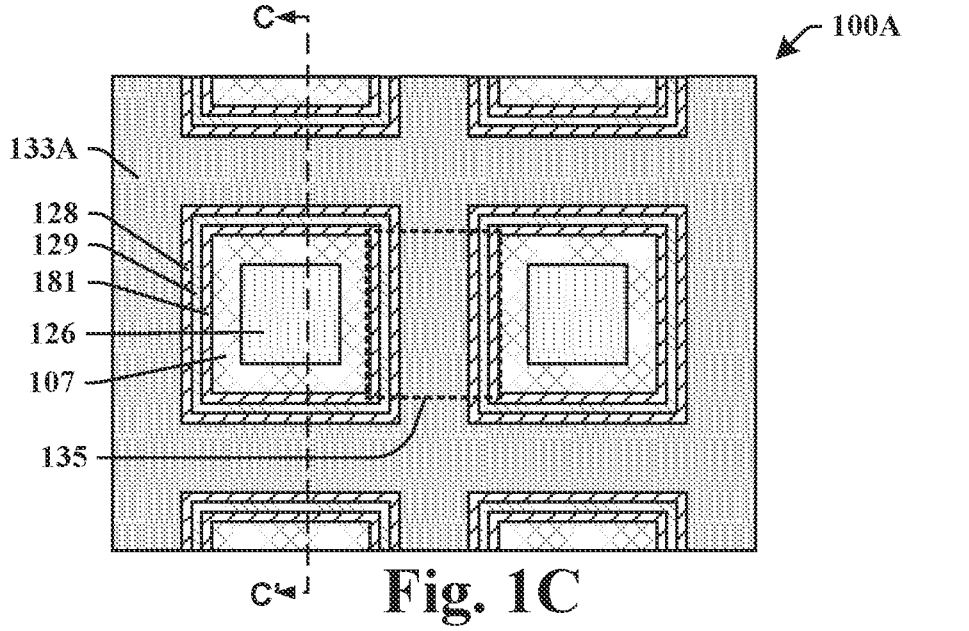
FIG. 1C provides a cutaway plan view taken along the line C-C' of FIG. 1B.

FIG. 1B provides an expanded view of a portion of FIG. 1A that includes the BDTI structure 134A. FIG. 1C provides a plan view taken along the line C-C' of FIG. 1B. It should be appreciated that the illustrations exaggerate the dimensions of the BDTI structure 134A in comparison to the dimensions of the photodetectors 126 in order to show details of the BDTI structure 134A. In some embodiments, the BDTI structure 134A occupies about 20% or less of the image sensing area 114. In some embodiments, the BDTI structure 134A occupies about 10% or less of the image sensing area 114.

The BDTI structure 134A includes a dielectric liner 131 and a core 171. The core 171 includes the substrate-embedded metal grid 133A and a lower grid 175 directly below substrate-embedded metal grid 133A. The substrate-embedded metal grid 133A and the lower grid 175 each laterally surrounding the photodetectors 126. The substrate-embedded metal grid 133A is uppermost in terms of the orientation used in the illustrations. In that orientation, the back side 101 is up.

The substrate-embedded metal grid 133A includes an upper part 179 and a lower part 177. The lower part 177 is embedded in the first semiconductor substrate 107. The upper part 179 is above the back side 101 and cuts through the intermediate passivation layer 137 and the upper passivation layer 138. An etch stop layer 181 extends over the back side 101 beneath the intermediate passivation layer 137 and dips into the first semiconductor substrate 107 to go underneath the substrate-embedded metal grid 133A. At or just below a base of the intermediate passivation layer 137, at a height that is above the back side 101, the substrate-embedded metal grid 133A undergoes a step change from a first width $W_1$ to a second width $W_2$.

The lower grid 175 is fully embedded in the first semiconductor substrate 107 and is between the substrate-embedded metal grid 133A and the front side 108. The dielectric liner 131 extends over the back side 101 beneath the intermediate passivation layer 137 and the etch stop layer 181, dips into the first semiconductor substrate 107 to go underneath the substrate-embedded metal grid 133A and the lower grid 175, and laterally separates the substrate-embedded metal grid 133A and the lower grid 175 from the first semiconductor substrate 107. The dielectric liner 131 and the etch stop layer 181 together encapsulated the lower grid 175.

The dielectric liner 131 is transparent and includes one or more layers of any suitable dielectrics. In some embodiments, the dielectric liner 131 includes one or more layers of dielectrics that exhibit fixed negative charges. Examples of dielectrics that exhibit fixed negative charges include hafnium oxide ($HfO_2$), aluminum oxide (AlO), and the like. In some embodiments, the dielectric liner 131 includes a first dielectric layer 128 and a second dielectric layer 129. For example, the first dielectric layer 128 may be aluminum oxide (AlO) or the like and the second dielectric layer 129 may be hafnium oxide ($HfO_2$) or the like. In some embodiments, the first dielectric layer 128 has a thickness in the range from about 20 Angstroms to about 100 Angstroms, e.g., about 40 Angstroms. In some embodiments, the second dielectric layer 129 has a thickness in the range from about 30 Angstroms to about 200 Angstroms, e.g., about 60 Angstroms. In some embodiments, the dielectric liner 131 as a whole has a thickness in the range from about 50 Angstroms to about 200 Angstroms, e.g., about 100 Angstroms.

The etch stop layer 181 is also transparent and may include one or more layers of any suitable materials. In some embodiments, the etch stop layer 181 includes one or more layers of dielectrics that exhibit fixed negative charges. In some embodiments, the etch stop layer 181 has the same composition as one of the layers in the dielectric liner 131. For example, the etch stop layer 181 may be aluminum oxide (AlO) or the like. In some embodiments, the etch stop layer 181 is about 100 Angstroms or less in thickness.

The intermediate passivation layer 137 and the upper passivation layer 138 are much thicker than either the dielectric liner 131 or the etch stop layer 181. The upper passivation layer 138 may be any suitable material that is transparent and has a relatively low refractive index. Materials that may be suitable include silicon dioxide ($SiO_2$), silicon nitride (SiN), hafnium oxide ($HfO_2$), titanium dioxide ($TiO_2$), and the like. In some embodiments, the upper passivation layer 138 is or comprises silicon dioxide ($SiO_2$) or the like. In some embodiments, the upper passivation layer 138 has a thickness in the range from about 300 Angstroms to about 2500 Angstroms, e.g., about 500 Angstroms.

The intermediate passivation layer 137 is a transparent material that has a refractive index between that of the upper passivation layer 138 and that of the first semiconductor substrate 107. Materials that may be suitable include tantalum pentoxide ($Ta_2O_5$), silicon nitride (SiN), hafnium oxide ($HfO_2$), aluminum oxide (AlO), titanium dioxide ($TiO_2$), or the like. In some embodiments, the intermediate passivation layer 137 is tantalum pentoxide ($Ta_2O_5$) or the like. In some embodiments, the intermediate passivation layer 137 has a thickness in the range from about 300 Angstroms to about 2500 Angstroms, e.g., about 500 Angstroms. The thicknesses of the intermediate passivation layer 137 and the upper passivation layer 138 may be varied in relation to a wavelength of light that is targeted by the IC device 100A.

The lower grid 175 of the core 171 may be any suitable material. In some embodiments, the lower grid 175 is metal. The metal may be the same as that of the substrate-embedded metal grid 133A. Metal has a high reflectance and may improve quantum efficiency. In some embodiments, the lower grid 175 is a non-metal. A non-metal may be better adapted to the process of forming the lower grid 175. In some embodiments, the lower grid 175 is transparent and has a lower refractive index than the first semiconductor substrate 107. In some embodiments, the lower grid 175 is dielectric. Examples of materials that may be suitable include silicon dioxide ($SiO_2$), silicon nitride (SiN), hafnium oxide ($HfO_2$), aluminum oxide (AlO), titanium dioxide ($TiO_2$), and the like. In some embodiments, lower grid 175 is or comprises silicon dioxide ($SiO_2$) or the like.

The substrate-embedded metal grid 133A may be any suitable metal. In some embodiments, the substrate-embedded metal grid 133A is or comprises aluminum (Al), tungsten (W), or the like. Aluminum and tungsten have the advantage of being amenable to deposition in high aspect ratio openings. In some embodiments, the substrate-embedded metal grid 133A comprises tungsten (W), or the like. Tungsten (W) is particularly suitable for deposition in high aspect ratio openings. In some embodiments, the substrate-embedded metal grid 133A comprises aluminum (Al) or the like. Aluminum (Al) has the advantage of high conductivity.

The BDTI structure 134A extends through the upper passivation layer 138, though the intermediate passivation layer 137, and into the first semiconductor substrate 107 to within a distance Di of the front side 108. In some embodiments, the distance Di is in the range from zero to about 2 μm. In some embodiments, the distance Di is in the range from 0.5 μm to about 1.5 μm, e.g., about 1 μm. Having the BDTI structure 134A come close to the front side 108 reduces crosstalk between the photodetectors 126. Spacing the BDTI structure 134A from the front side 108 allows structures such as floating diffusion regions 123 to be formed directly beneath the segments 135.

The first semiconductor substrate 107 has a thickness suitable for the photodetectors 126. In some embodiments, the first semiconductor substrate 107 has a thickness in the range from about 2 μm to about 5 μm. In some embodiments, the first semiconductor substrate 107 has a thickness in the range from about 3 μm to about 3.5 μm. In some embodiments, the BDTI structure 134A extends to a depth in the range from about 1.5 μm to about 3.5 μm into the first semiconductor substrate 107. In some embodiments, the BDTI structure 134A extends to a depth in the range from about 2 μm to about 3 μm into the first semiconductor substrate 107.

The lower grid 175 may have a height selected so as to limit the aspect ratio of the substrate-embedded metal grid 133A. The lower grid 175 may be anywhere from entirely absent up to about 50% of the height of the core 171. In some embodiments the lower grid 175 is from about 10% to about 30% of the height of the core 171. In some embodiments the aspect ratio of the substrate-embedded metal grid 133A is in the range from about 10:1 to about 30:1. In some embodiments the aspect ratio of the substrate-embedded metal grid 133A is in the range from about 15:1 to about 25:1. The aspect ratio may be calculated as the ratio of the height of the substrate-embedded metal grid 133A to its width at the narrowest point above the back side 101, e.g., about $W_2$.

Figure 2A:
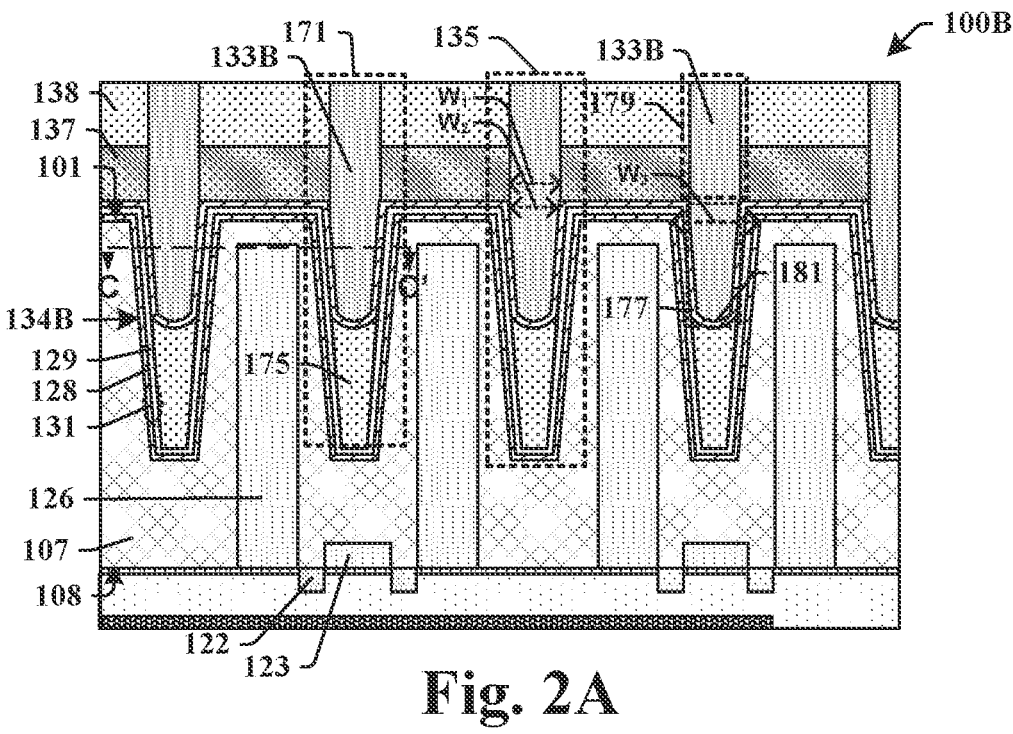
FIG. 2A illustrates a cross-sectional side view of an IC device according to some aspects of the present disclosure.
Figure 2B:
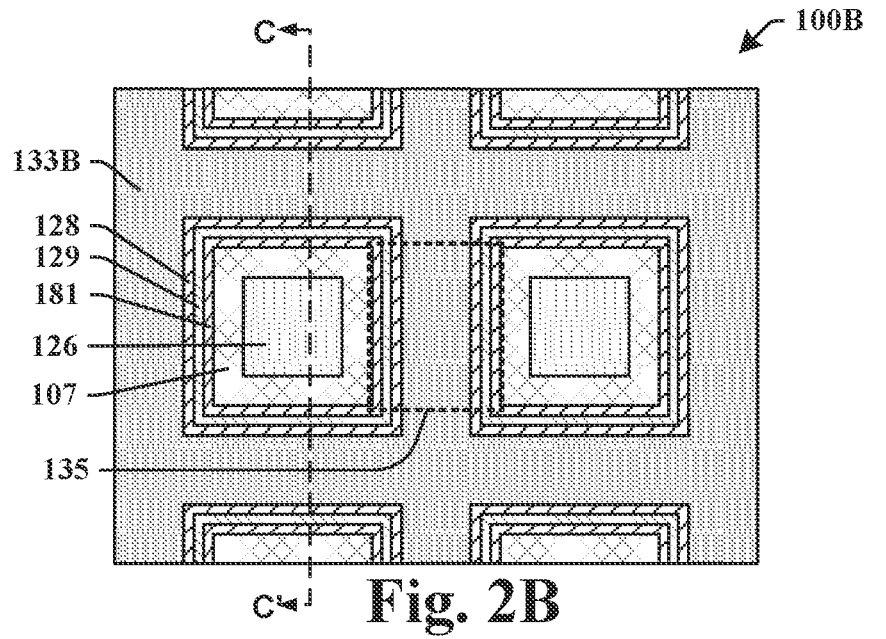
FIG. 2B provides a cutaway plan view taken along the line C-C' of FIG. 2A.

FIGS. 2A and 2B are cross-sectional and plan views illustrating an IC device 100B that includes a BDTI structure 134B. The BDTI structure 134B has a substrate-embedded metal grid 133B with dimensions distinct from those of the BDTI structure 134A shown in FIGS. 1B and 1C. In the BDTI structure 134A shown in FIGS. 1B and 1C, the width $W_1$ of the upper part 179 is greater than the width $W_2$ of the lower part 177 and may be similar to a width $W_3$ of the trenches in the first semiconductor substrate 107 within which the BDTI structure 134A is formed. In the BDTI structure 134B of FIGS. 2A and 2B, the width $W_1$ of the upper part 179 is less than the width $W_3$ of and may be close to the width $W_2$ of the lower part 177. Making the width $W_1$ of the upper part 179 smaller increases quantum efficiency. In some embodiments, the width $W_1$ is within about 10% of the width $W_2$. In some embodiments, the width $W_1$ is within about 5% of the width $W_2$.

Figure 3A:
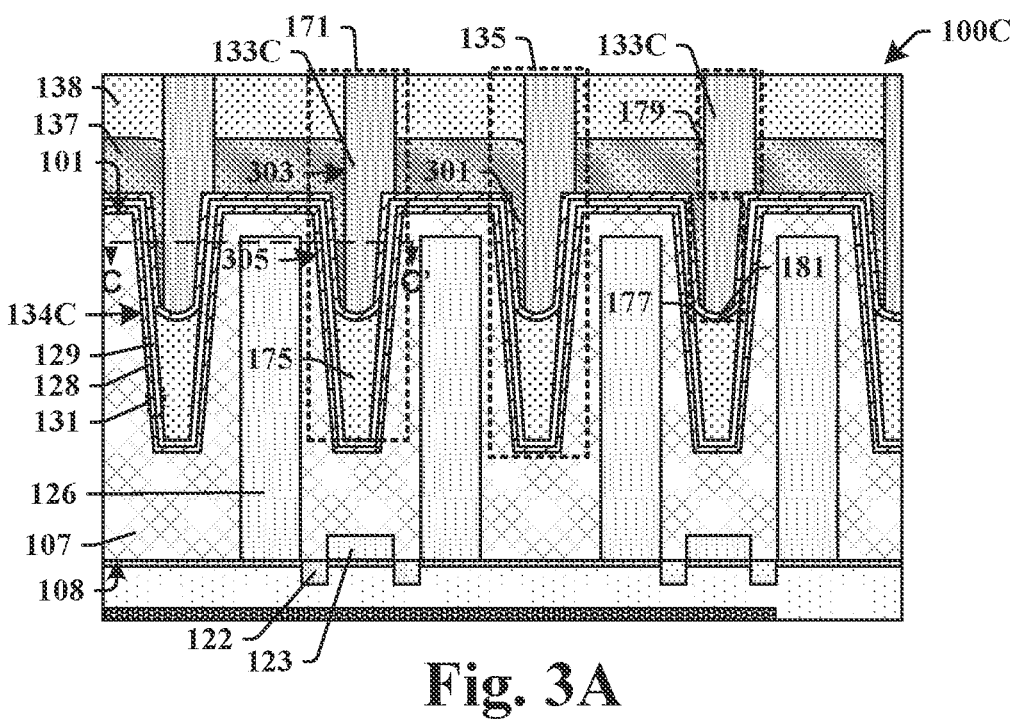
FIG. 3A illustrates a cross-sectional side view of an IC device according to some aspects of the present disclosure.
Figure 3B:
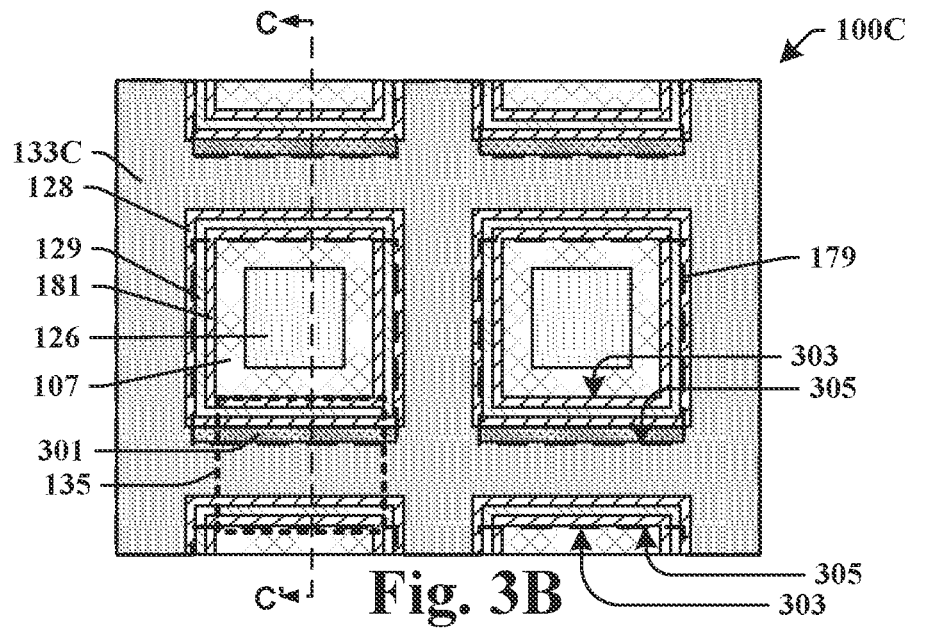
FIG. 3B provides a cutaway plan view taken along the line C-C' of FIG. 3A.

FIGS. 3A and 3B are cross-sectional and plan views illustrating an IC device 100C that includes a BDTI structure 134C. The BDTI structure 134C has a substrate-embedded metal grid 133C that has the same dimensions as the BDTI structure 134B shown in FIGS. 2A and 2B but has an asymmetry resulting from a manufacturing process. The asymmetry causes trenches 303 in the intermediate passivation layer 137, which are filled by the upper part 179 of the substrate-embedded metal grid 133C, to be offset from trenches 305 in the semiconductor substrate 107 that are filled by the BDTI structure 134C. Likewise, the upper part 179 of the substrate-embedded metal grid 133C is offset with respect to the lower part 177 of the substrate-embedded metal grid 133C and other portions of the BDTI structure 134C that are within the first semiconductor substrate 107. In some embodiments, the offset is such that there is a gap 301 between the substrate-embedded metal grid 133C and the etch stop layer 181 on one side of a segment 135. The gap 301 may be filled by the intermediate passivation layer 137 whereby a sliver of the intermediate passivation layer 137 extends into the first semiconductor substrate 107.

Figure 4A:
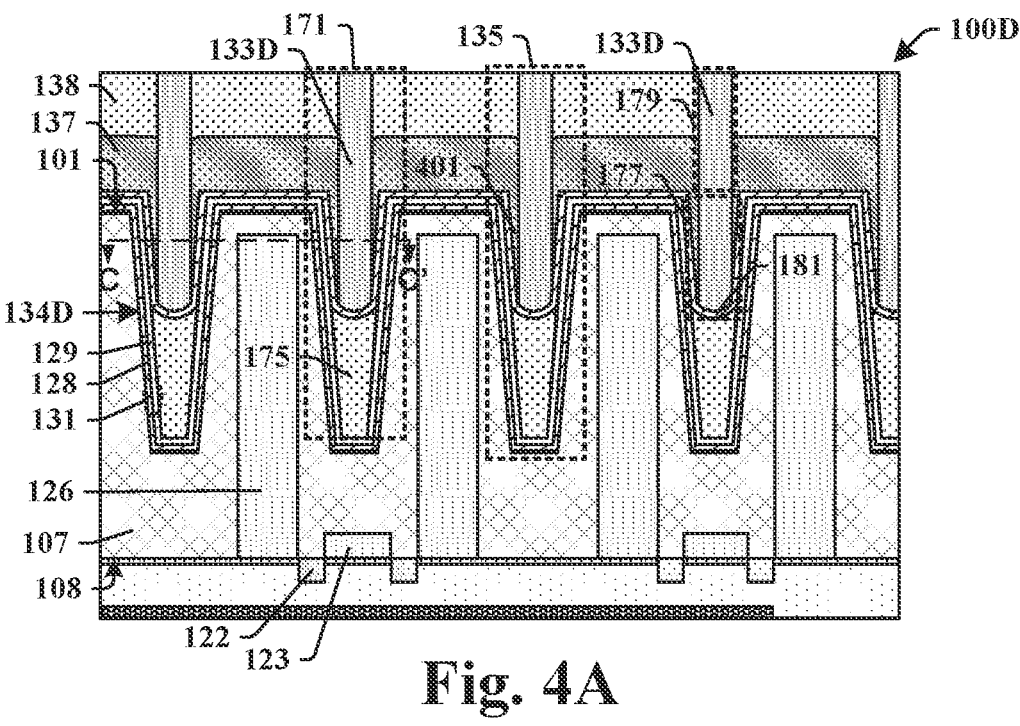
FIG. 4A illustrates a cross-sectional side view of an IC device according to some aspects of the present disclosure.
Figure 4B:
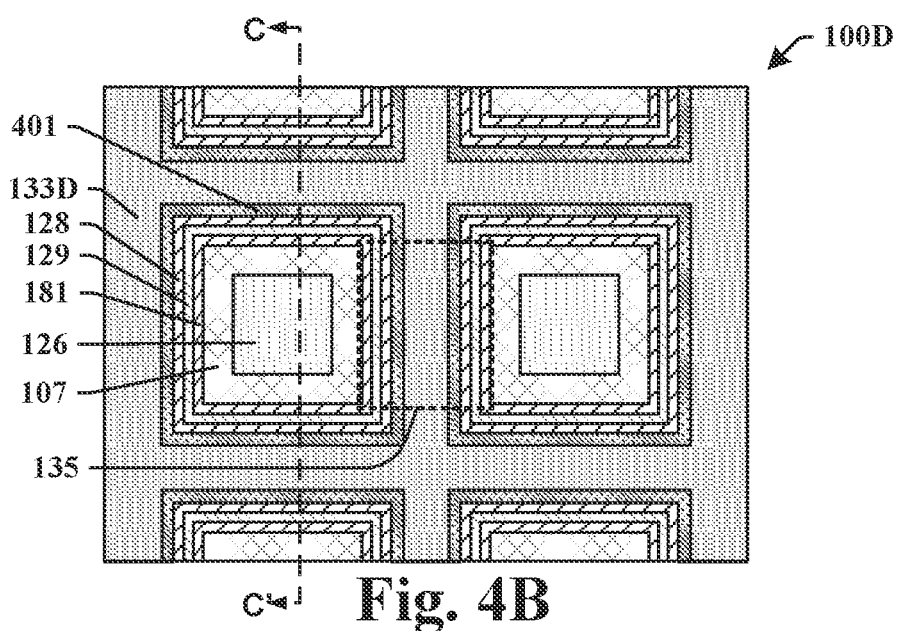
FIG. 4B provides a cutaway plan view taken along the line C-C' of FIG. 4A.

FIGS. 4A and 4B are cross-sectional and plan views illustrating an IC device 100D that includes a BDTI structure 134D. The BDTI structure 134D has a substrate-embedded metal grid 133D that is like the substrate-embedded metal grid 133B of FIGS. 2A and 2B but is narrower still. The narrowness and the alignment are such that slivers 401 of the intermediate passivation layer 137 extend into the first semiconductor substrate 107 on both sides of the lower part 177. The slivers 401 may surround the photodetectors 126.

Figure 5A:
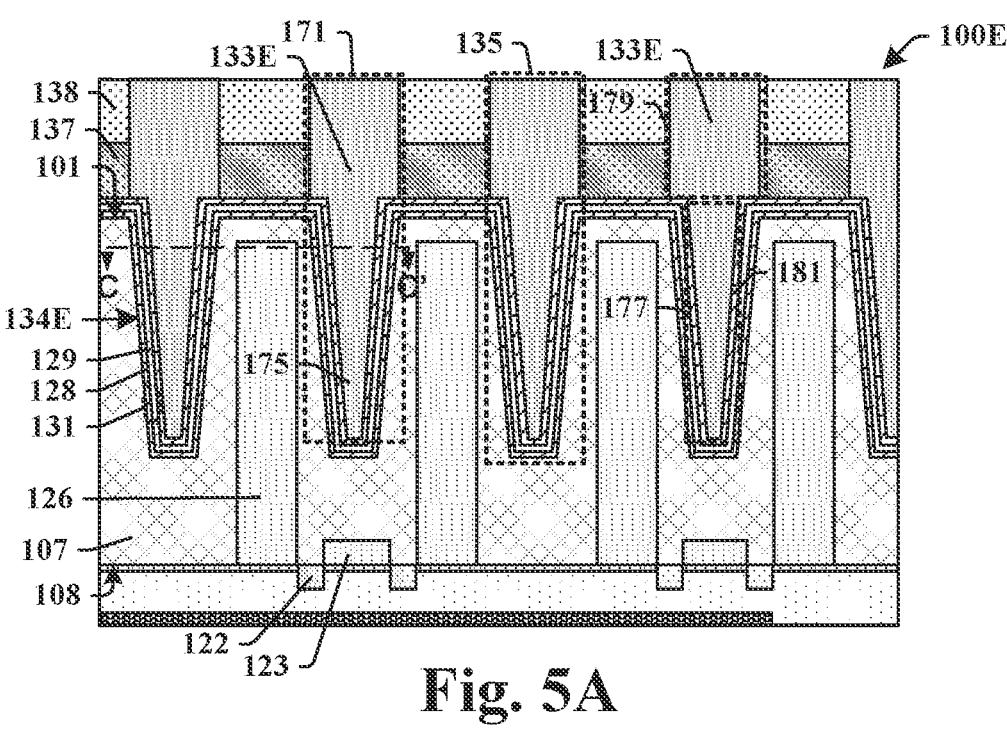
FIG. 5A illustrates a cross-sectional side view of an IC device according to some aspects of the present disclosure.
Figure 5B:
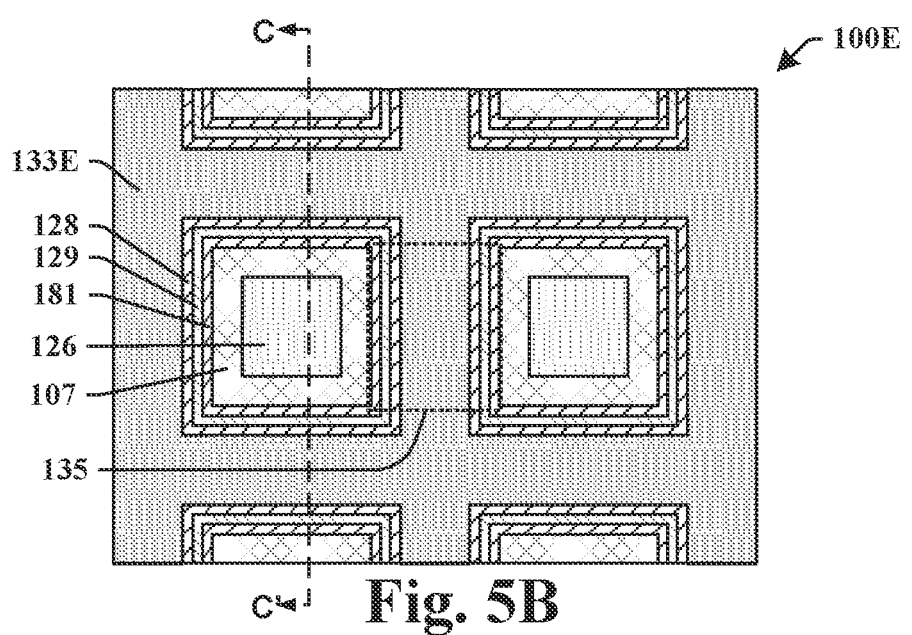
FIG. 5B provides a cutaway plan view taken along the line C-C' of FIG. 5A.

FIGS. 5A and 5B are cross-sectional and plan views illustrating an IC device 100E that includes a BDTI structure 134E. The BDTI structure 134E is like the BDTI structure 134A shown in FIGS. 1B and 1C except that the lower grid 175 of the BDTI structure 134A is entirely absent from the BDTI structure 134E. Instead, the BDTI structure 134E has a substrate-embedded metal grid 133E that extends through the height of the BDTI structure 134E down to the dielectric liner 131.

Figure 6A:
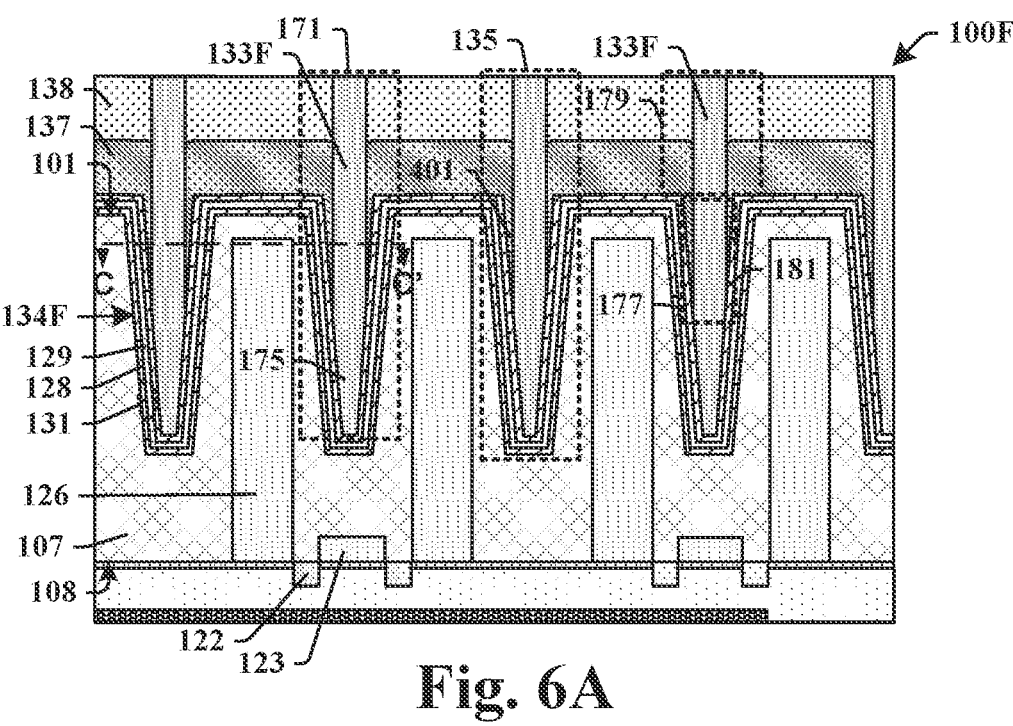
FIG. 6A illustrates a cross-sectional side view of an IC device according to some aspects of the present disclosure.
Figure 6B:
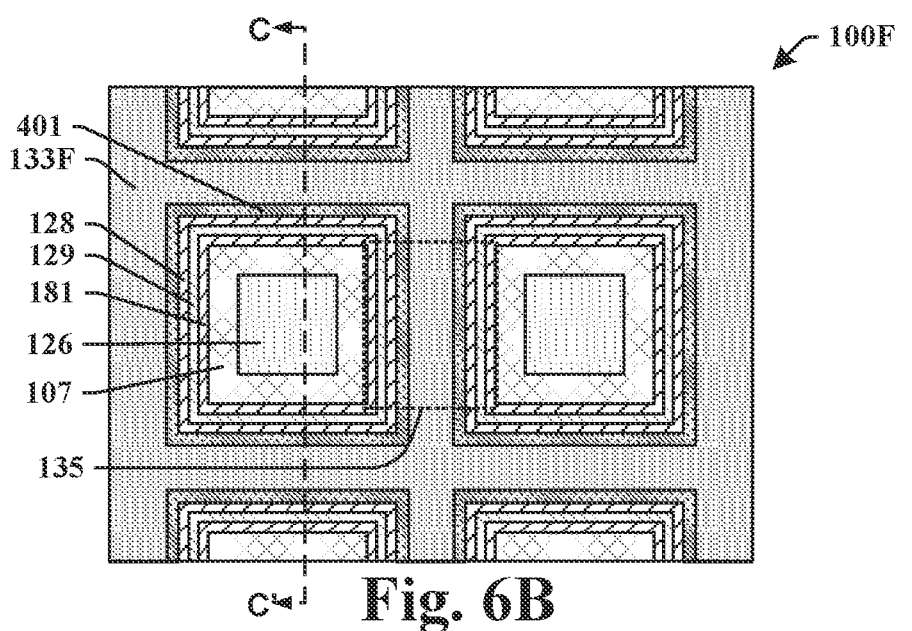
FIG. 6B provides a cutaway plan view taken along the line C-C' of FIG. 6A.

FIGS. 6A and 6B are cross-sectional and plan views illustrating an IC device 100F that includes a BDTI structure 134F. The BDTI structure 134F is like the BDTI structure 134D shown in FIGS. 4A and 4B except that the lower grid 175 of the BDTI structure 134B is entirely absent from the BDTI structure 134F. Instead, the BDTI structure 134F has a substrate-embedded metal grid 133F that extends through the height of the BDTI structure 134F down to the dielectric liner 131.

Returning to FIG. 1A, the contact pad 103 may be disposed in the first semiconductor substrate 107 proximate the front side 108 and be spaced apart from the back side 101 by a pad dielectric 102. The pad dielectric 102 may be covered by an encapsulation layer 145. Access to the contact pad 103 from the back side 101 may be provided by an opening 165 that extends through the encapsulation layer 145 and the pad dielectric 102. The encapsulation layer 145 may have a concave surface 167 that facilitates bonding to the contact pad 103 through the opening 165.

The composite grid 149 may be disposed directly above the BDTI structure 134A and between the color filters 146. The composite grid 149 may include the back side metal grid 141, a dielectric grid 142, and a hard mask grid 143. The encapsulation layer 145 may extend over the composite grid 149. The back side metal grid 141 has ground bars 141B that extend into the first semiconductor substrate 107 within the peripheral area 112A to ground the back side metal grid 141.

In addition to the first semiconductor substrate 107 and the first metal interconnect 109, the IC device 100A may include a second semiconductor substrate 111 and a second metal interconnect 110. A plurality of logic gates 113 may be disposed on the second semiconductor substrate 111. The second semiconductor substrate 111, the second metal interconnect 110, and associated devices may be manufactured separately from the first semiconductor substrate 107 and may provide image signal processing (ISP) circuitry, read and/or write circuitry, or other suitable circuitry for the operation of the photodetectors 126.

The first metal interconnect 109 comprises first wires 121 and first vias 119 in the first interlevel dielectric 120. These may be arranged as a plurality of metallization layer that may be referred as the M1 metallization layer, the M2 metallization layer, etc. in order of distance from the first semiconductor substrate 107. The second metal interconnect 110 comprises second wires 115 and second vias 118 in a second interlevel dielectric 117.

FIGS. 7-34 are cross-sectional view illustrations exemplifying a method according to the present disclosure of forming the IC device 100A. While FIGS. 7-34 are described with reference to various embodiments of a method, it will be appreciated that the structures shown in FIGS. 7-34 are not limited to the method but rather may stand alone separate from the method. While FIGS. 7-34 are described as a series of acts, it will be appreciated that the order of the acts may be altered in other embodiments. While FIGS. 7-34 illustrate and describe a specific set of acts, some acts that are illustrated and/or described may be omitted in other embodiments. Further, acts that are not illustrated and/or described may be included in other embodiments. While the method of FIGS. 7-34 is described in terms of forming the IC device 100A, the method and variants thereof may be used to form other IC devices according to the present disclosure.

Figure 7:
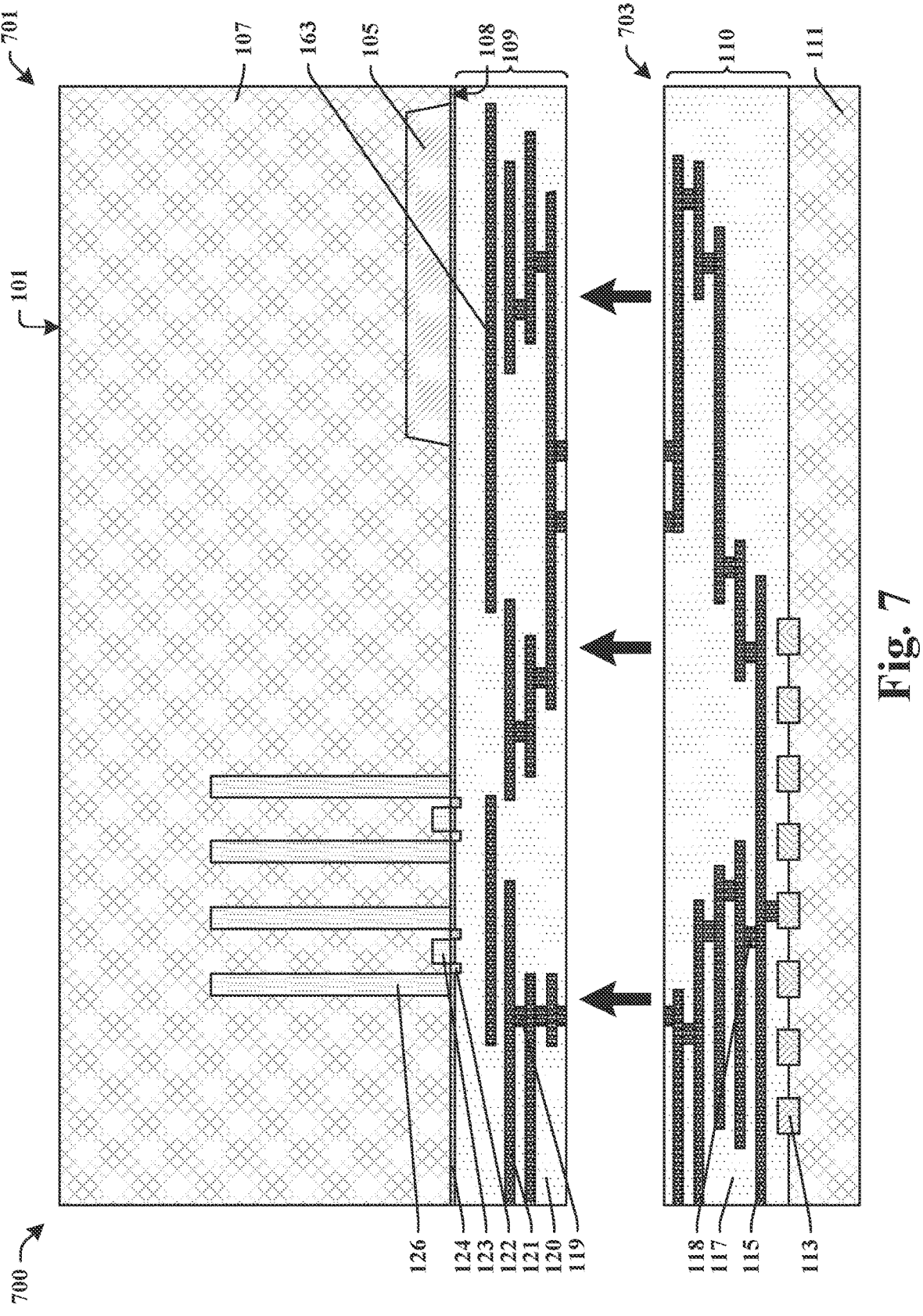
FIGS. 7-29 are a series of cross-sectional view illustrations exemplifying a method according to some aspects of the present disclosure for forming an IC device that includes an CIS having a BDTI structure according to some embodiments.

As shown by the cross-sectional view 700 of FIG. 7, the method may begin with bonding together a partially manufactured IC device 701 and a second IC device 703. Each of the IC device 701 and the second IC device 703 may have been subjected to front-end-of-line (FEOL) and back-end-of-line (BEOL) processing. In the IC device 701, FEOL processing provides photodetectors 126, the floating diffusion regions 123, and the transfer gates 122. BEOL processing provides the first metal interconnect 109. In the second IC device 703, FEOL processing provides the logic gates 113 and like structures and BEOL processing provides the second metal interconnect 110. Bonding occurs between the first metal interconnect 109 may and the second metal interconnect 110. The bonding process may be fusion bonding, hybrid bonding, the like, or some other suitable bonding process. After bonding, the first semiconductor substrate 107 may be thinned from the back side 101 to provide a structure as illustrated by the cross-sectional view 800 of FIG. 8.

Each of the first semiconductor substrate 107 and the second semiconductor substrate 111 may be or comprise a bulk silicon substrate, a silicon-on-insulator (SOI) substrate, the like, or some other suitable semiconductor substrate. In some embodiments an etch stop layer 124 is disposed directly on the front side 108. The etch stop layer 124 is a dielectric and may be an oxide, a carbide, a nitride, or the like. Each of the first interlevel dielectric 120 and the second interlevel dielectric 117 may be or comprise silicon dioxide ($SiO_2$), a low-K dielectric, an extremely low-K dielectric, or the like. The first wires 121, the first vias 119, the second wires 115, the second vias 118, and the metal pad 163 may be or comprise copper (Cu), aluminum (Al), the like, or some other suitable metal. In some embodiments, the metal pad 163 is copper (Cu) or the like. The isolation structure 105 may be a shallow trench isolation structure, field oxide, or any other suitable type of isolation structure. The photodetectors 126, the floating diffusion regions 123, and the transfer gates 122 may constitute active-pixel sensors with pinned photodiodes. More generally, the photodetectors 126 may be any types of photodetectors.

Figure 8:
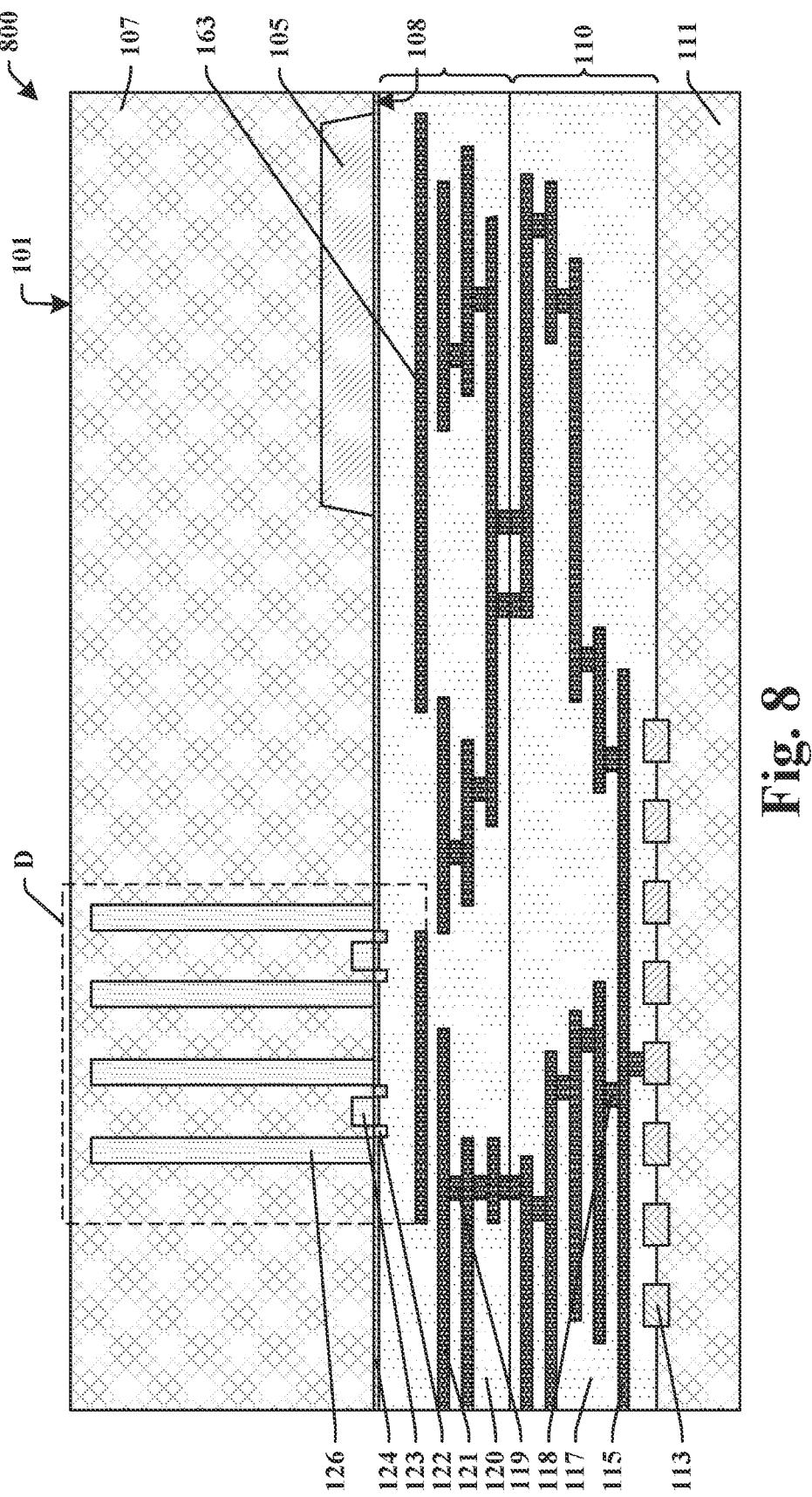

The cross-sectional views 900-1500 of FIGS. 9-15 corresponds to the area D of the cross-sectional view 800 of FIG. 8. As shown by the cross-sectional view 900 of FIG. 9, a mask 903 may be formed on the back side 101 by photolithography or some other process and used to etch trenches 901 of width $W_3$ in the first semiconductor substrate 107. After etching the trenches 901, the mask 903 may be stripped.

Figure 10:
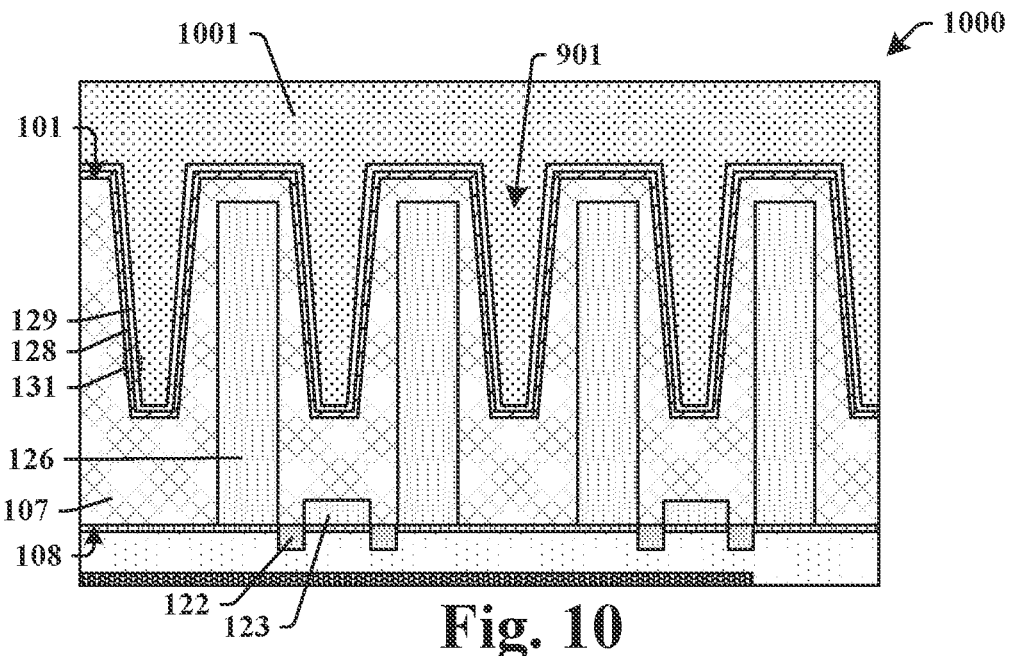

As shown by the cross-sectional view 1000 of FIG. 10, the first dielectric layer 128, the second dielectric layer 129, and a lower fill layer 1001 may be sequentially deposited. The first dielectric layer 128 and the second dielectric layer 129 may be deposited by a conformal deposition process and provide the dielectric liner 131. The conformal deposition process may be physical vapor deposition (PVD), chemical vapor deposition (CVD), atomic layer deposition (ALD), the like, or some other suitable process. The lower fill layer 1001 may be deposited by a process that is effective for filling high aspect ratio openings. The process may be PVD, CVD, ALD, the like, or some other suitable process. In some embodiments, the process is plasma enhanced chemical vapor deposition. In some embodiments, the lower fill layer 1001 is or comprises silicon dioxide ($SiO_2$).

Figure 11:
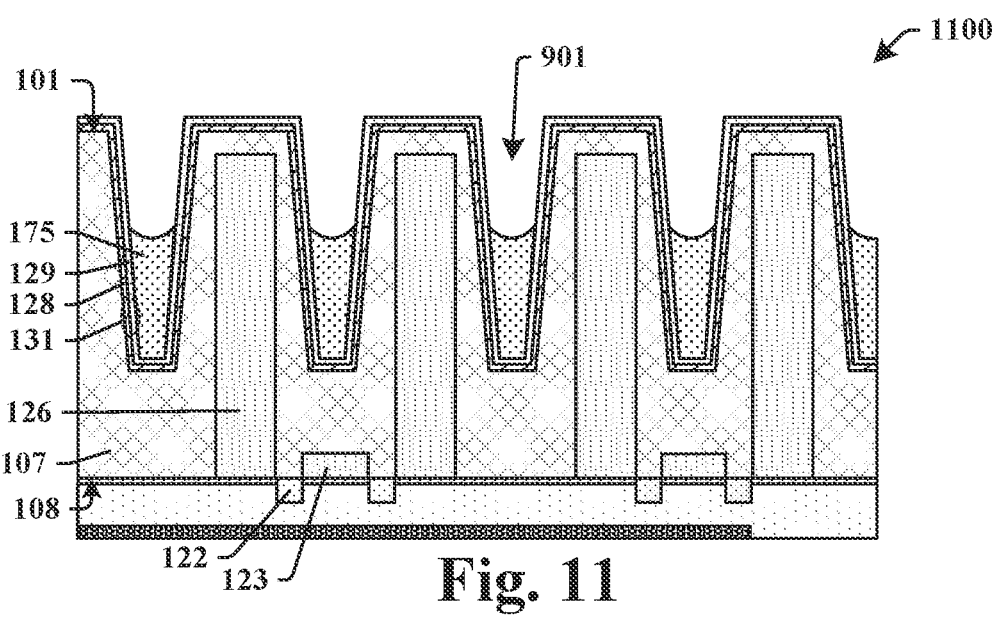

As shown by cross-sectional view 1100 of FIG. 11, an etch process may be carried out to remove the lower fill layer 1001 except for a portion that is recessed within the trenches 901 and provides the lower grid 175. The etch process may be any suitable etch process. In some embodiments, the etch process is a wet etch or the like. A wet etch may facilitate providing selectivity for removing the material of the lower fill layer 1001 over the second dielectric layer 129.

Figure 12:
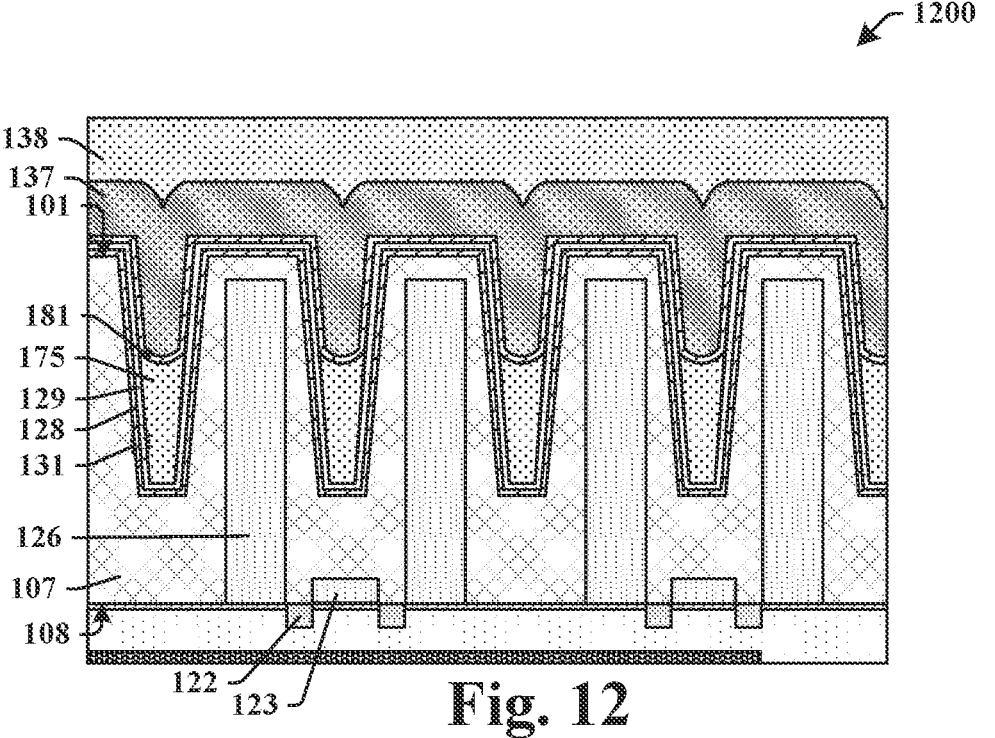

As shown by the cross-sectional view 1200 of FIG. 12, the etch stop layer 181, the intermediate passivation layer 137, and the upper passivation layer 138 may be sequentially deposited. The deposition processes may include PVD, CVD, ALD, the like, or any other suitable processes. A portion of the intermediate passivation layer 137 deposits within the trenches 901. In some embodiments, the upper passivation layer 138 is deposited to a thickness in the range from about 500 Angstroms to about 2000 Angstroms, e.g., about 1000 Angstroms.

Figure 13:
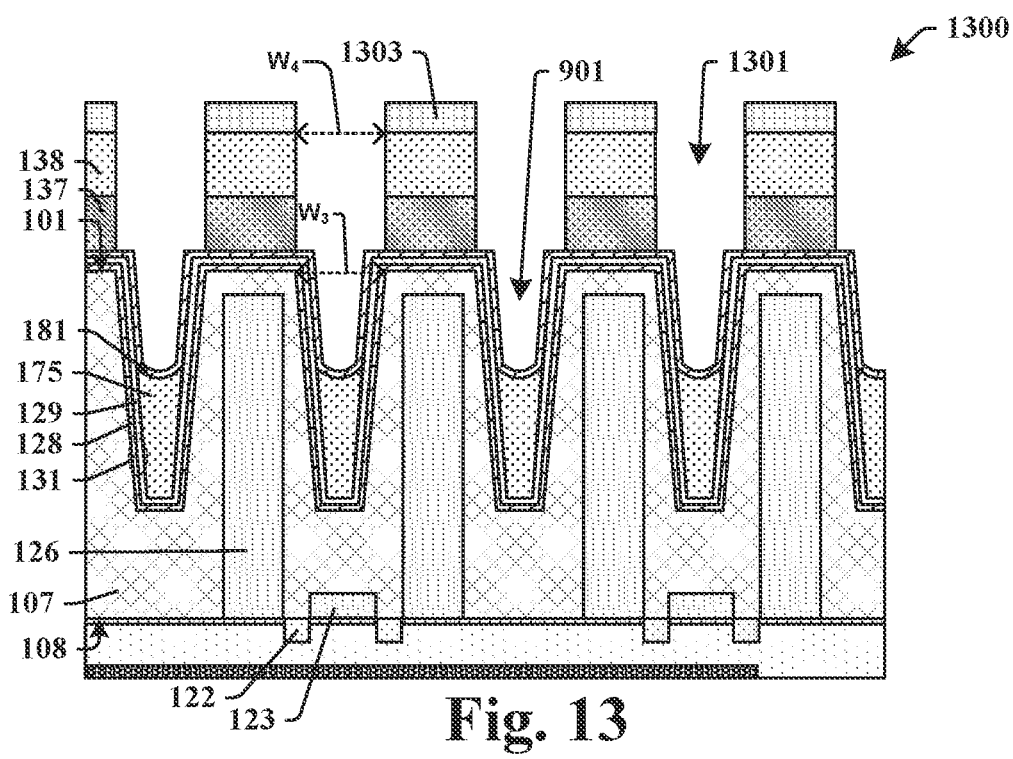

As shown by the cross-sectional view 1300 of FIG. 13, a mask 1303 is formed and used to etch trenches 1301 of width $W_4$ through the upper passivation layer 138 and the intermediate passivation layer 137. The trenches 1301 extend into the trenches 901 in the first semiconductor substrate 107 and stop on the etch stop layer 181. In some embodiments, the etch process removes the intermediate passivation layer 137 from the trenches 901. The etch process may be a dry etch such as a plasma etch or the like. In some embodiments, the width $W_4$ is greater than the width $W_3$ of the trenches 901. In some embodiments, the width $W_4$ is about equal to the width $W_3$. In some embodiments, the width $W_4$ is less than the width $W_3$. The trenches 1301 may be formed by a photolithographic process using the same reticle as a photolithographic process used to form the trenches 901. The relative width $W_4$ of the trenches 1301 may be varied in relation to the $W_3$ of the trenches 901 by controlling process conditions such as photoresist exposure time.

Figure 14:
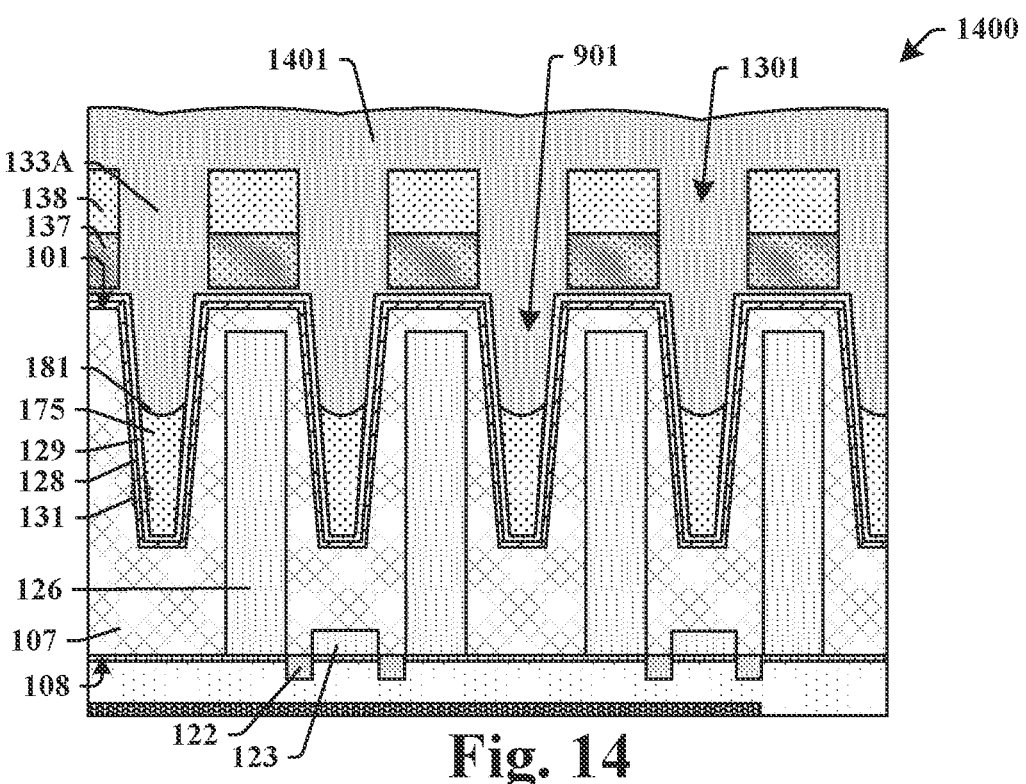

As shown by the cross-sectional view 1400 of FIG. 14, a metal 1401 may be deposited in such a way as to fill the trenches 1301 and the portion of the trenches 901 opened by the previous etch process. The metal may be deposited by PVD, CVD, ALD, electroplating, electroless plating, the like, or any other suitable process. The process may be adapted to fill high aspect ratio openings without creating voids.

Figure 15:
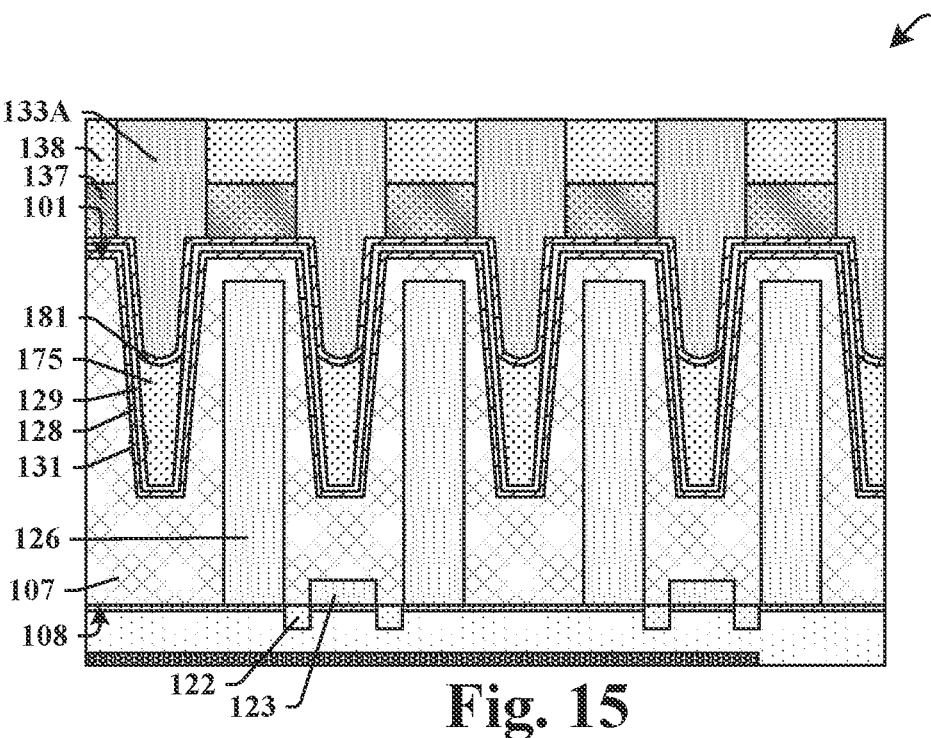

As shown by the cross-sectional view 1500 of FIG. 15, a planarization process may be carried out to define the substrate-embedded metal grid 133A from the metal 1401. The planarization process may be chemical mechanical polishing (CMP), the like, or some other suitable process. The planarization process may thin the upper passivation layer 138.

Figure 16:
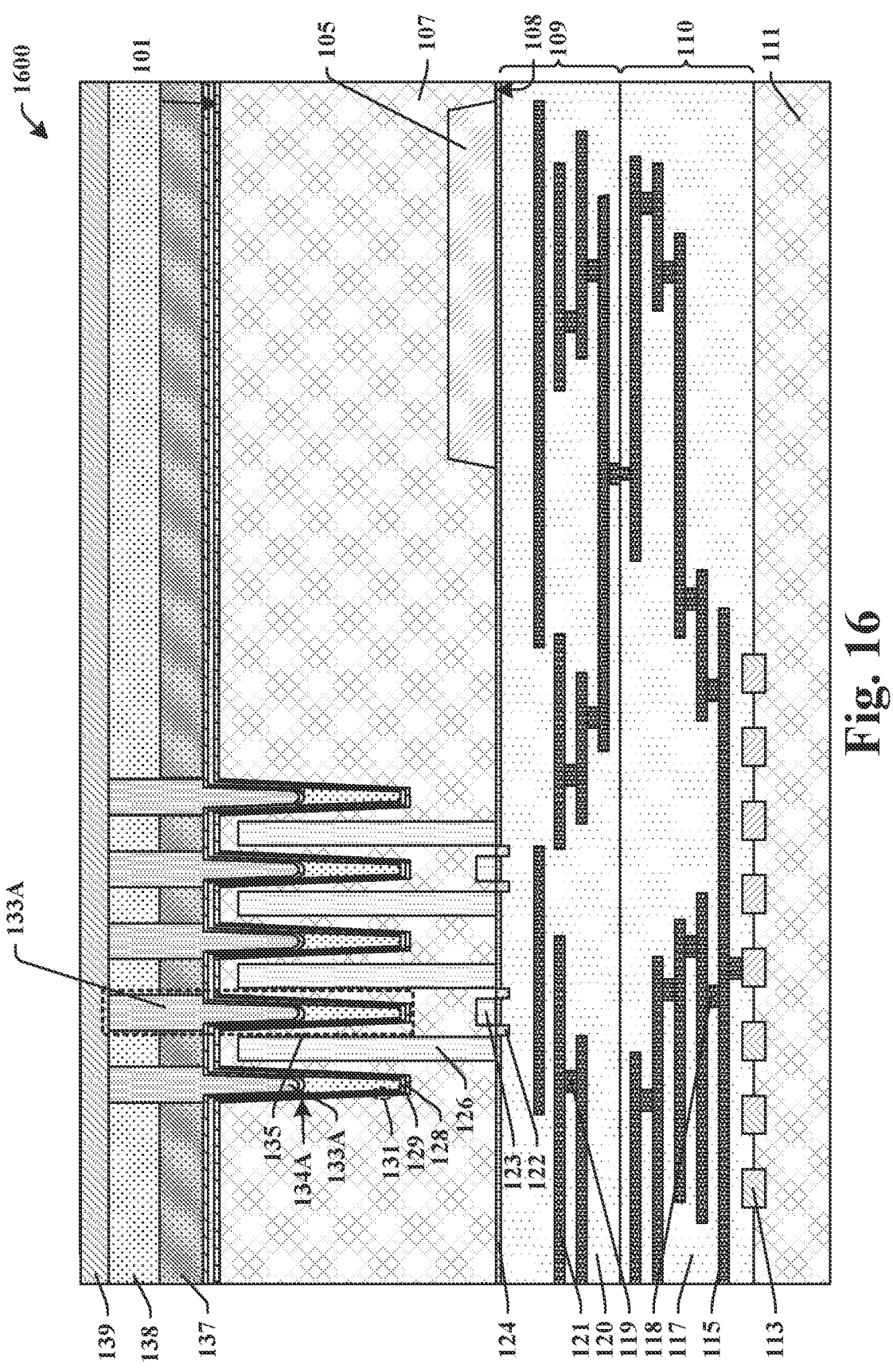

As shown by the cross-sectional view 1600 of FIG. 16, an etch stop layer 139 may be formed over the structure illustrated by the cross-sectional view 1500 of FIG. 15. The cross-sectional view 1600 of FIG. 16 provides a wider view than the cross-sectional view 1500 of FIG. 15. The etch stop layer 139 may be silicon nitride (SiN), the like, or some other suitable transparent material. The etch stop layer 139 may be formed by PVD, CVD, ALD, the like, or any other suitable process. In some embodiments, the etch stop layer 139 has a thickness in the range from about 500 Angstroms to about 1500 Angstroms, e.g., about 880 Angstroms. The etch stop layer 139 isolates the substrate-embedded metal grid 133A from the back side metal grid 141. Such isolation is not required and the encapsulation layer 139 may be omitted.

Figure 17:
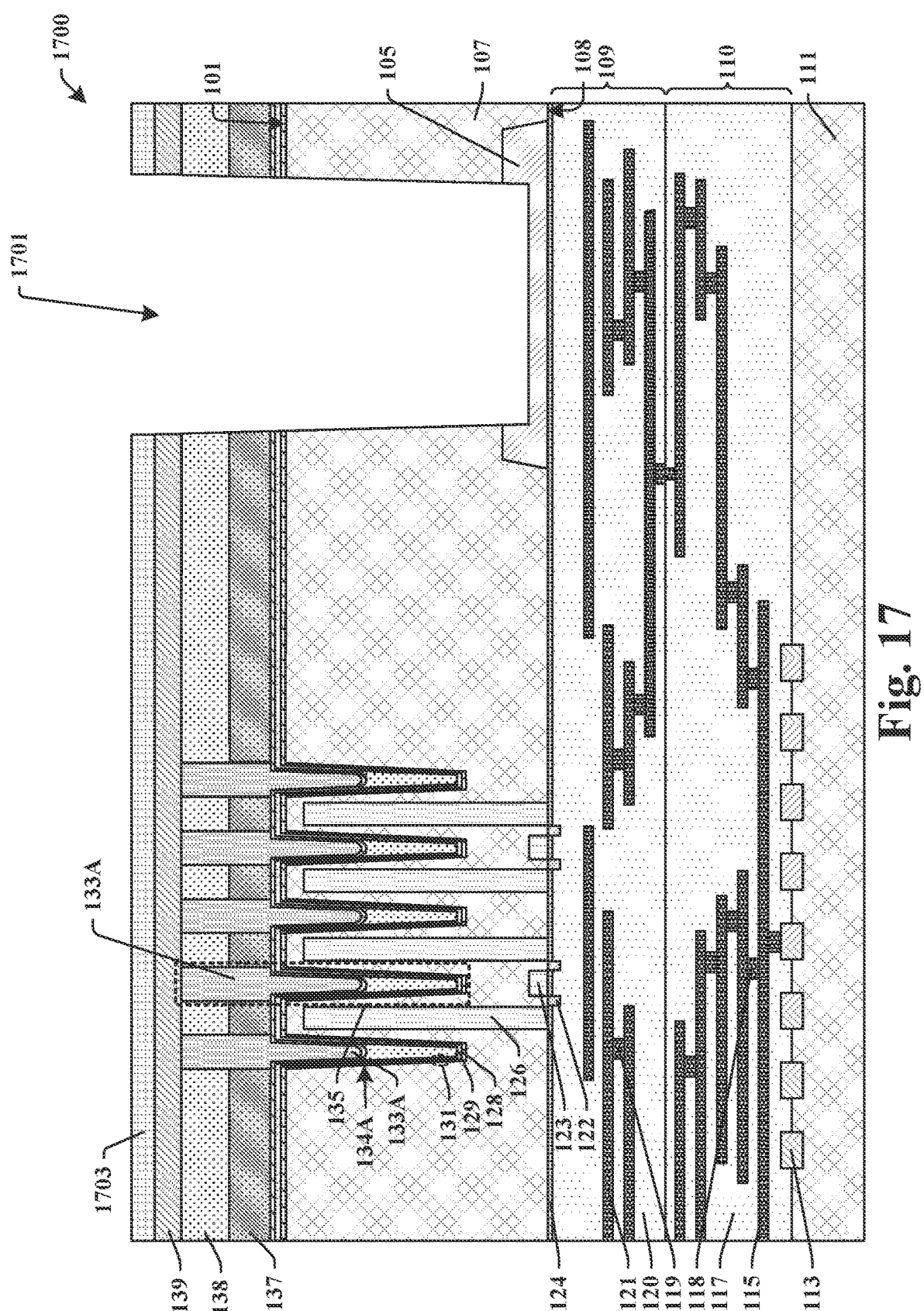

As shown by the cross-sectional view 1700 of FIG. 17 a mask 1703 may be formed and used to etch a pad opening 1701 in the first semiconductor substrate 107 within the outer peripheral area 112B. The etch may stop on the isolation structure 105 that was formed on the front side 108. After the etch, the mask 1703 may be stripped.

Figure 18:
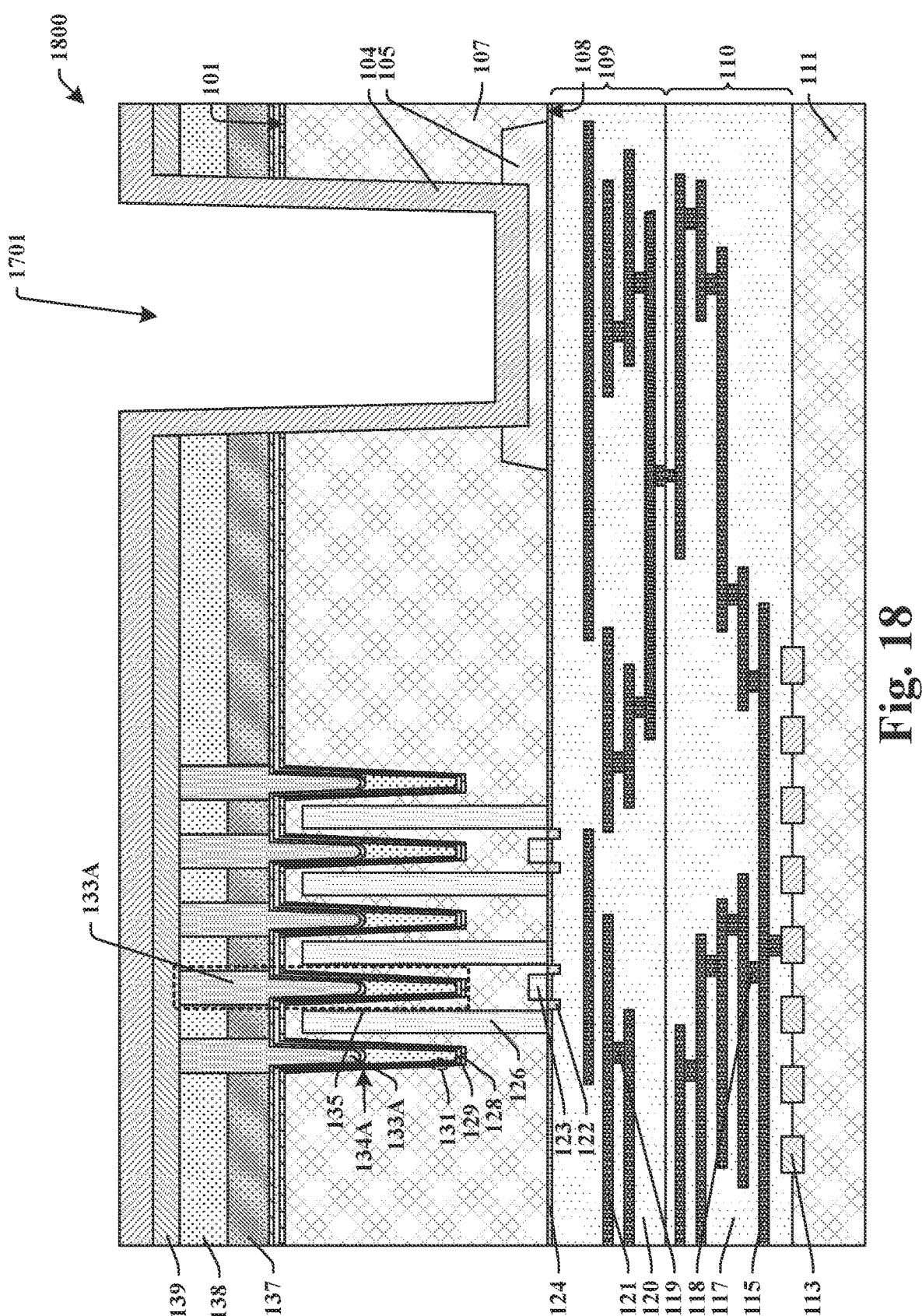

As shown by the cross-sectional view 1800 of FIG. 18, a pad dielectric liner 104 may be deposited over the structure shown by the cross-sectional view 1700 of FIG. 17. The pad dielectric liner 104 may be an oxide, the like, or some other suitable dielectric. In some embodiment, the pad dielectric liner 104 is from about 2000 Angstroms to about 5000 Angstroms thick. The pad dielectric liner may be deposited by PVD, CVD, the like, or any other suitable process.

Figure 19:
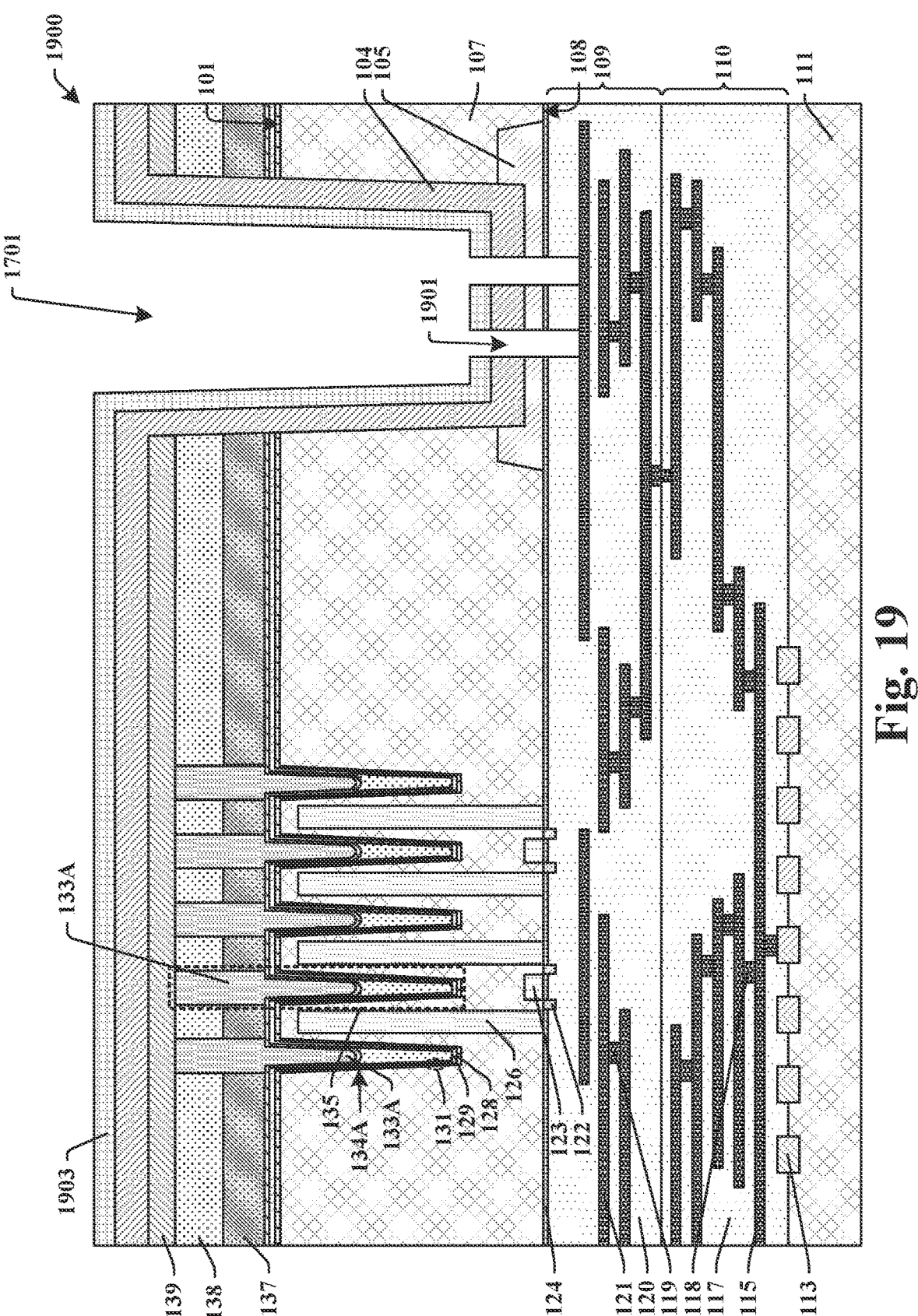

As shown by the cross-sectional view 1900 of FIG. 19, a mask 1903 may be formed and used to etch openings 1901 within the pad opening 1701. The metal pad 163 is exposed through the openings 1901. After the etch, the mask 1903 may be stripped.

Figure 20:
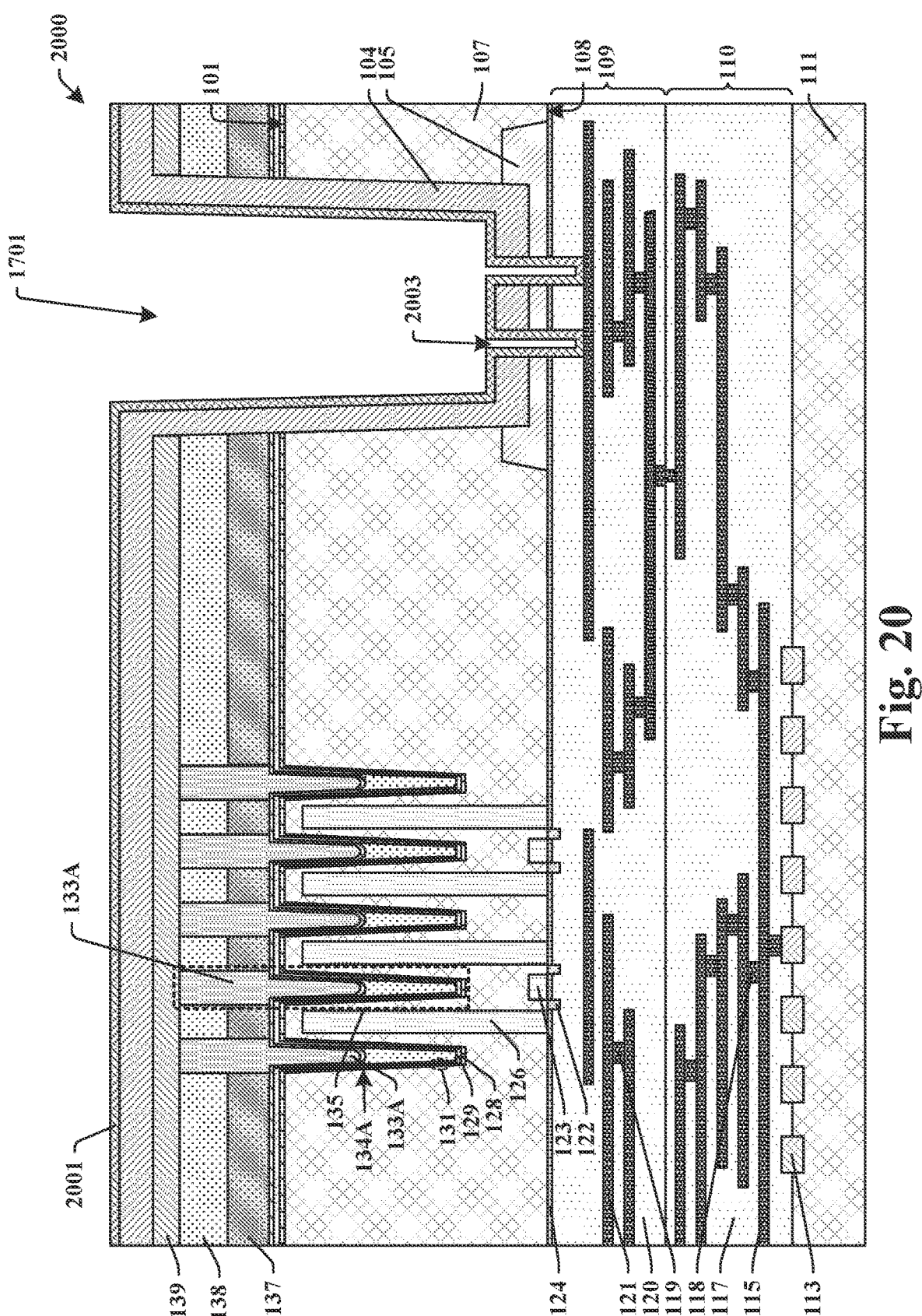

As shown by the cross-sectional view 2000 of FIG. 20, pad metal 2001 may be deposited over the structure illustrated by the cross-sectional view 1900 of FIG. 19, including within the openings 1901. Rather than completely fill the openings 1901, the pad metal 2001 may line the openings 1901 leaving slits 2003 in the pad metal 2001. The pad metal 2001 may be aluminum (Al), copper (Cu), the like, or any other suitable pad metal. The pad metal 2001 may be deposited by ALD, CVD, PVD, electroplating, electroless plating, or the like.

Figure 21:
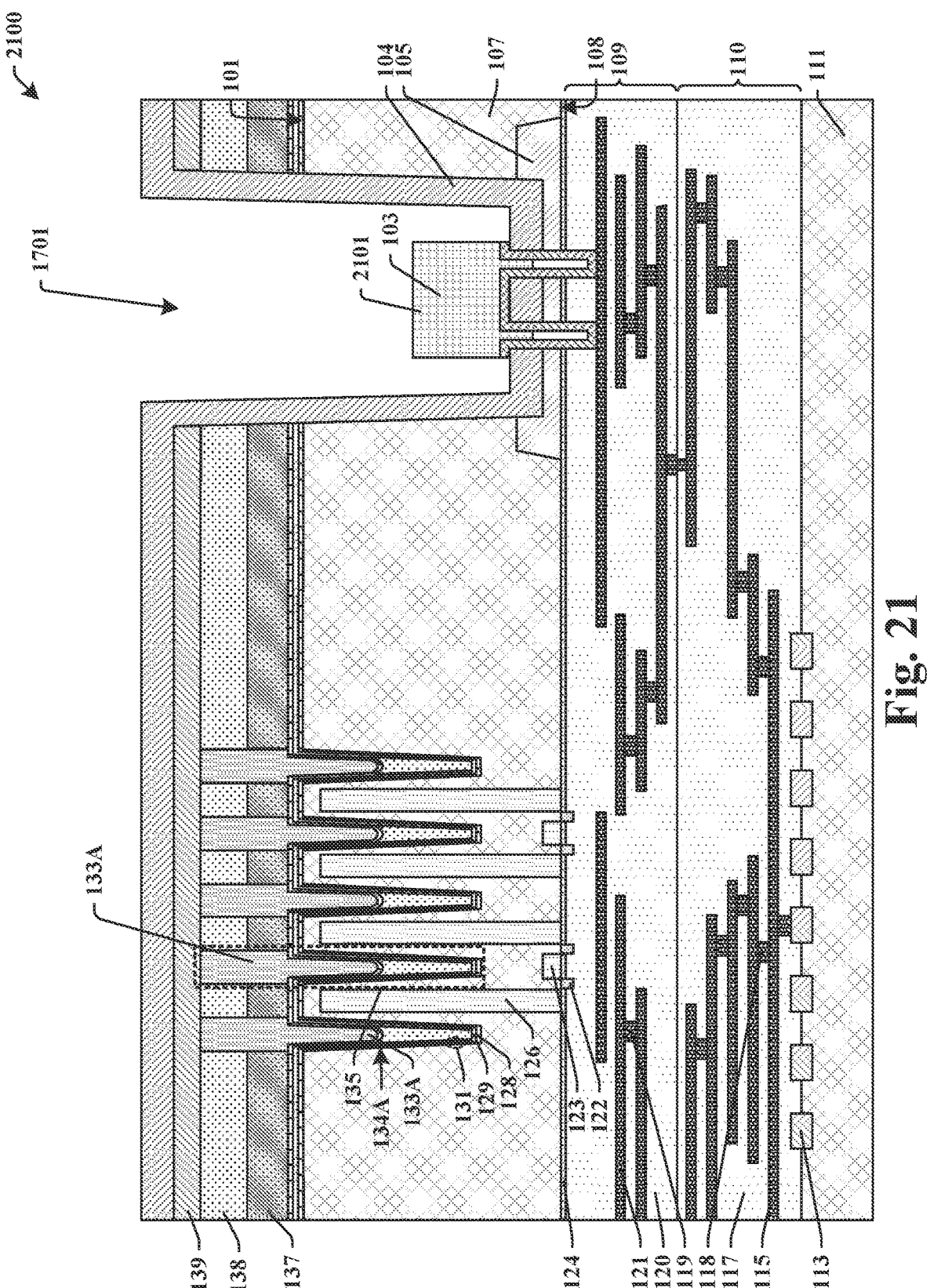

As shown by the cross-sectional view 2100 of FIG. 21, a mask 2101 may be formed and used to define the contact pad 103 from the pad metal 2001. After the etch, the mask 2101 may be stripped.

Figure 22:
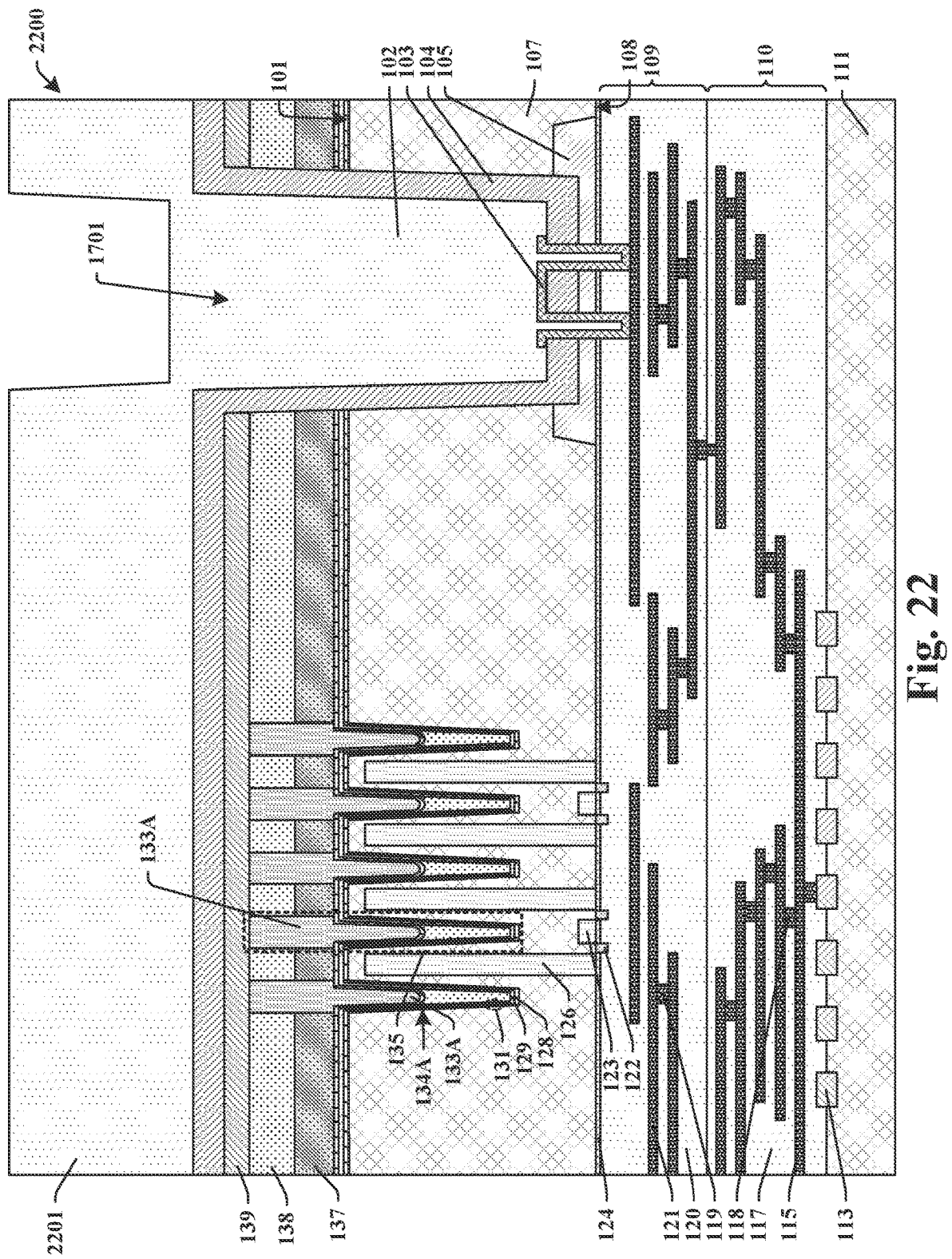

As shown by the cross-sectional view 2200 of FIG. 22, a pad dielectric 2201 may be deposited over the structure shown in the cross-sectional view 2100 of FIG. 21 to a thickness sufficient to fill the pad opening 1701. The pad dielectric 2201 may fill the slits 2003. The pad dielectric 2201 may be an oxide, the like, or another suitable dielectric. The pad dielectric 2201 may be deposited to by PVD, CVD, the like, or any other suitable process or combination of processes.

Figure 23:
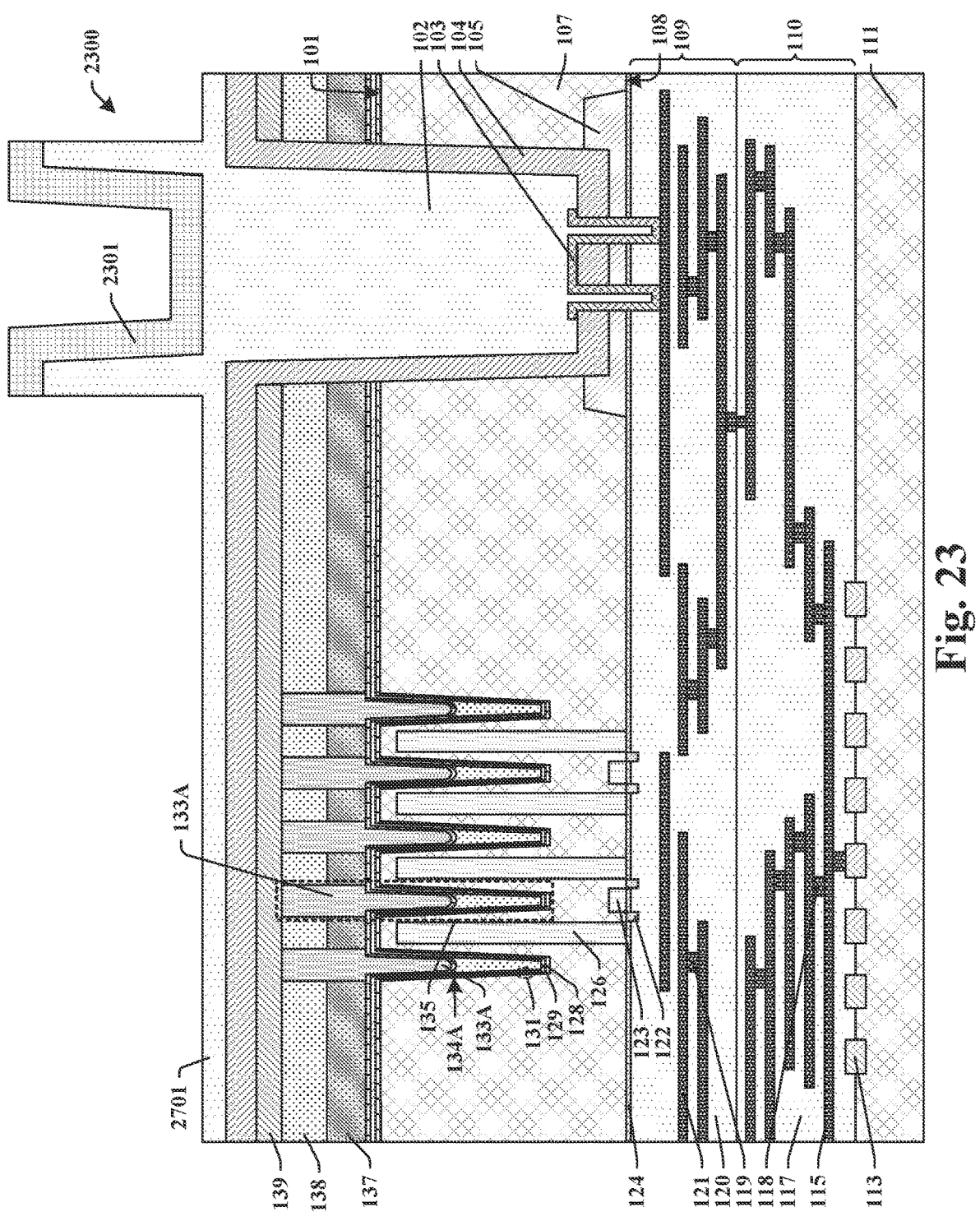
Figure 24:
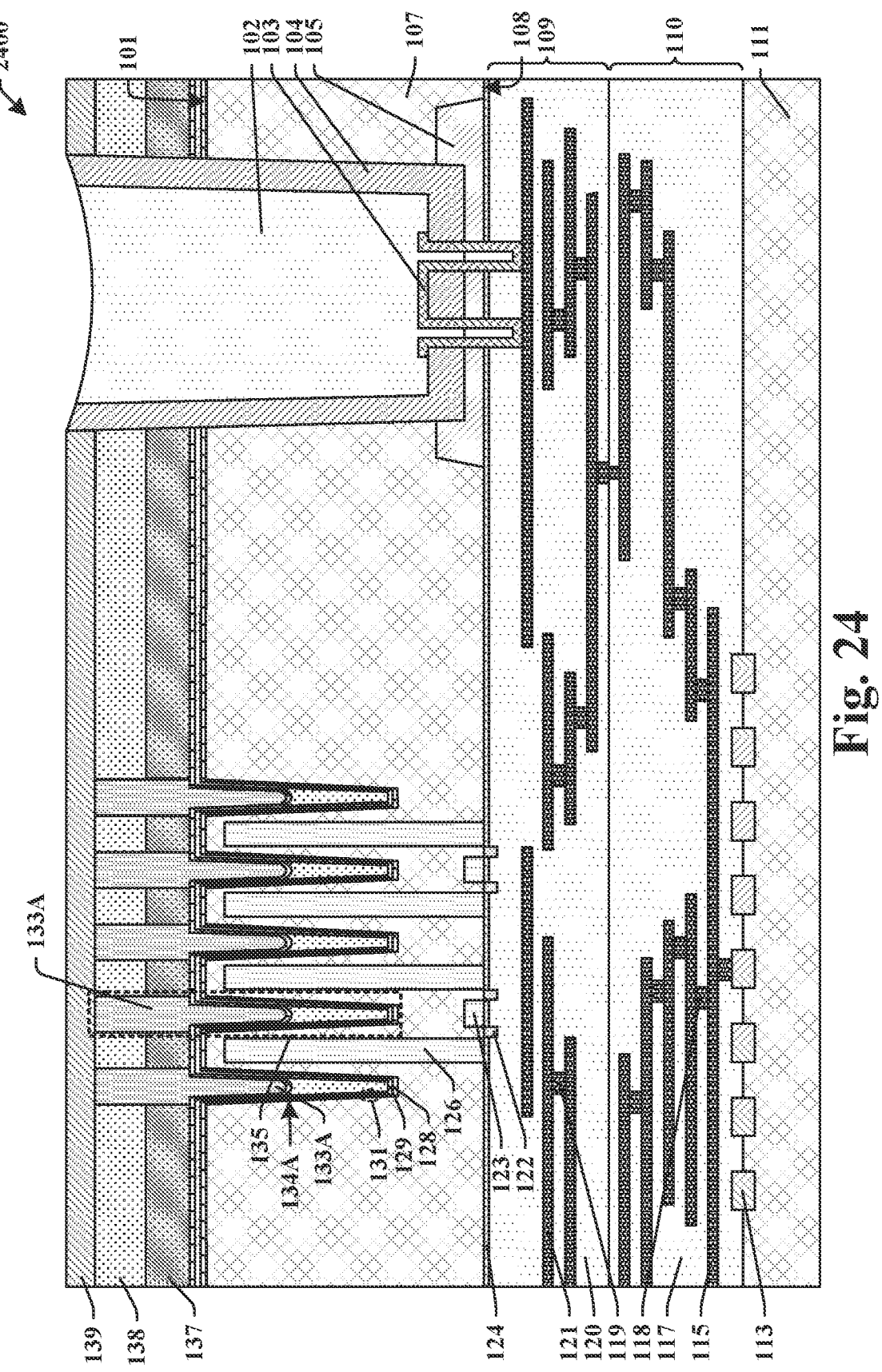

As shown by the cross-sectional view 2300 of FIG. 23, a mask 2301 may be formed and used to thin the pad dielectric 2201 in areas away from the contact pad 103. As shown by the cross-sectional view 2400 of FIG. 24, the mask 2301 is stripped followed by planarization and/or additional etching to form the pad dielectric 102 from the pad dielectric 2201. This processing facilitates providing the pad dielectric 102 with the concave surface 167. The planarization and/or additional etching may also remove portions of the pad dielectric 102 and the pad dielectric liner 104 that are outside the pad opening 1701.

Figure 25:
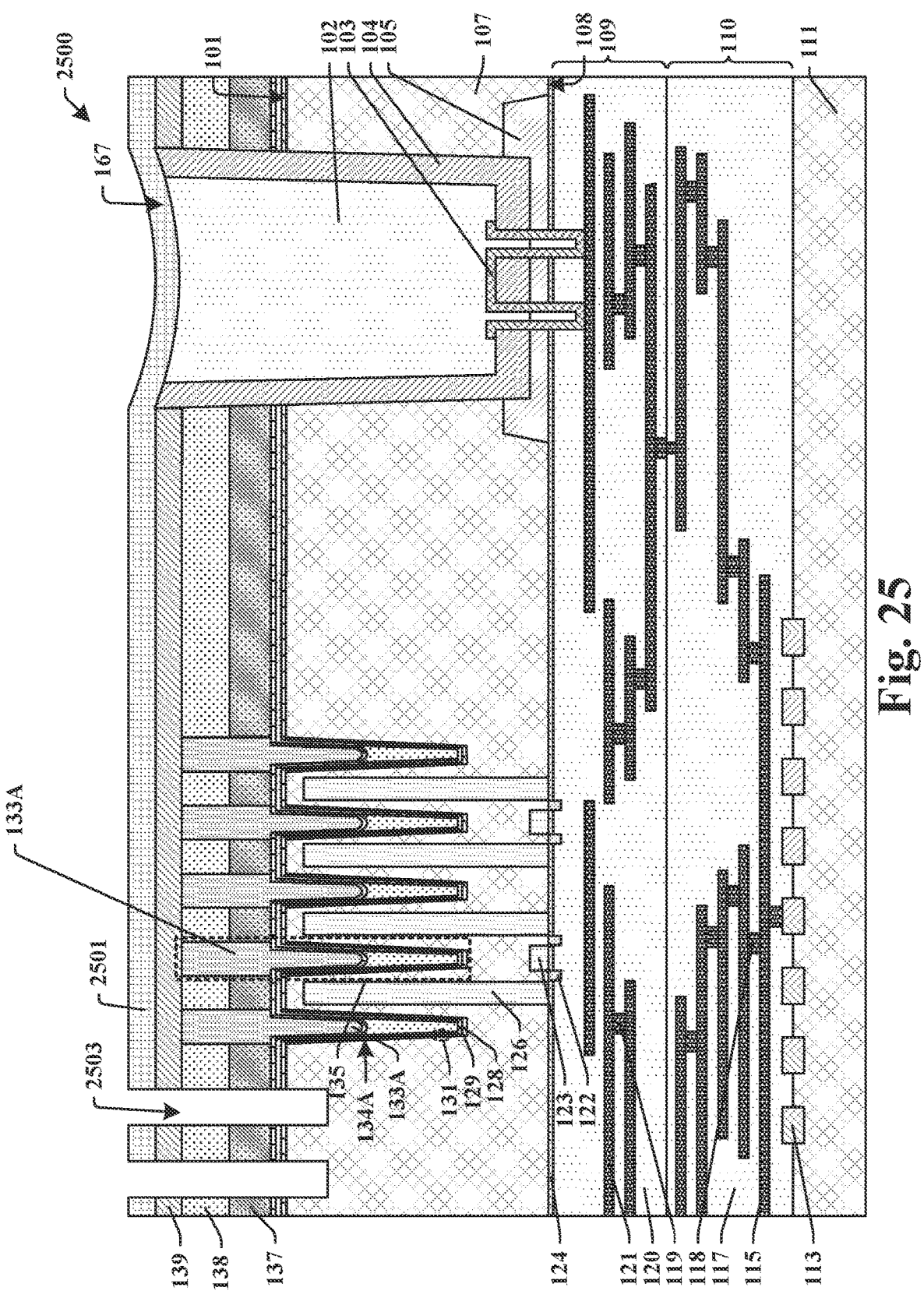

As shown by the cross-sectional view 2500 of FIG. 25, a mask 2501 may be formed and used to etch ground bar openings 2503 in the first semiconductor substrate 107 within the inner peripheral area 112A. The etch process may be a plasma etch or the like. After etching, the mask 2501 may be stripped.

Figure 26:
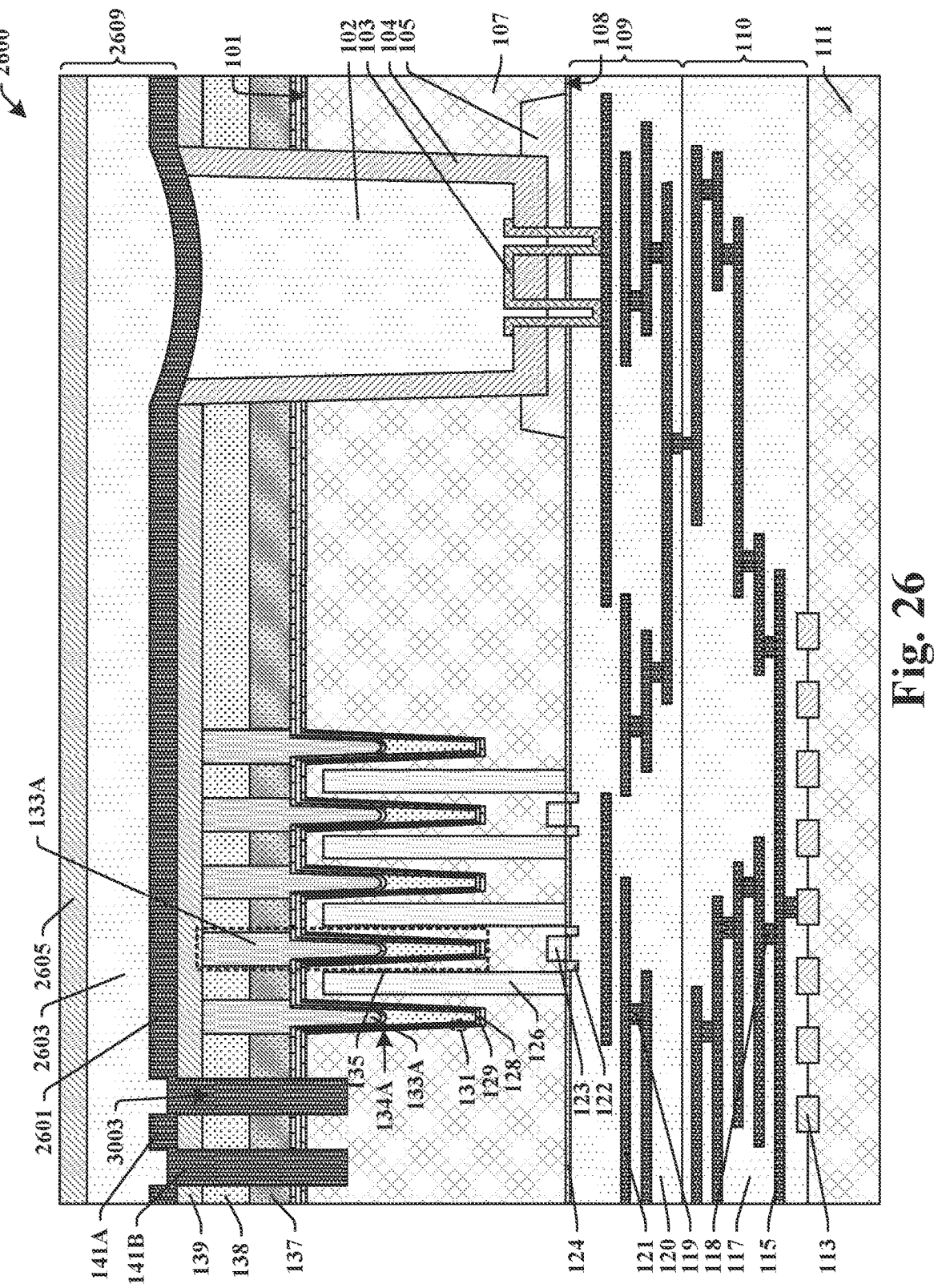

As shown by the cross-sectional view 2600 of FIG. 26, a composite grid stack 2609 may be deposited over the structure shown by the cross-sectional view 2500 of FIG. 25. The composite grid stack 2609 may include a metal layer 2601, a dielectric layer 2603, and a hard mask layer 2605. The metal layer 2601 forms the ground bars 141B within the ground bar openings 2503 and the portion 141A of the back side metal grid 141 that connects the ground bars 141B to the rest of the back side metal grid 141 (see FIG. 1A). The metal layer 2601 may comprise any suitable metal or combination of metals. In some embodiments, the metal layer 2601 is or comprises tungsten (W), or the like. In some embodiments, the metal layer 2601 includes a liner layer of titanium nitride (TiN), tantalum nitride (TaN), or the like. The dielectric layer 2603 may be silicon dioxide ($SiO_2$), the like, or any suitable dielectric. The hard mask layer 2605 may be a nitride, a carbide, the like, a combination thereof, or any other suitable hard mask material. These layers may be deposited by a combination of ALD, CVD, PVD, electroplating, electroless plating, the like, or any other suitable processes.

Figure 27:
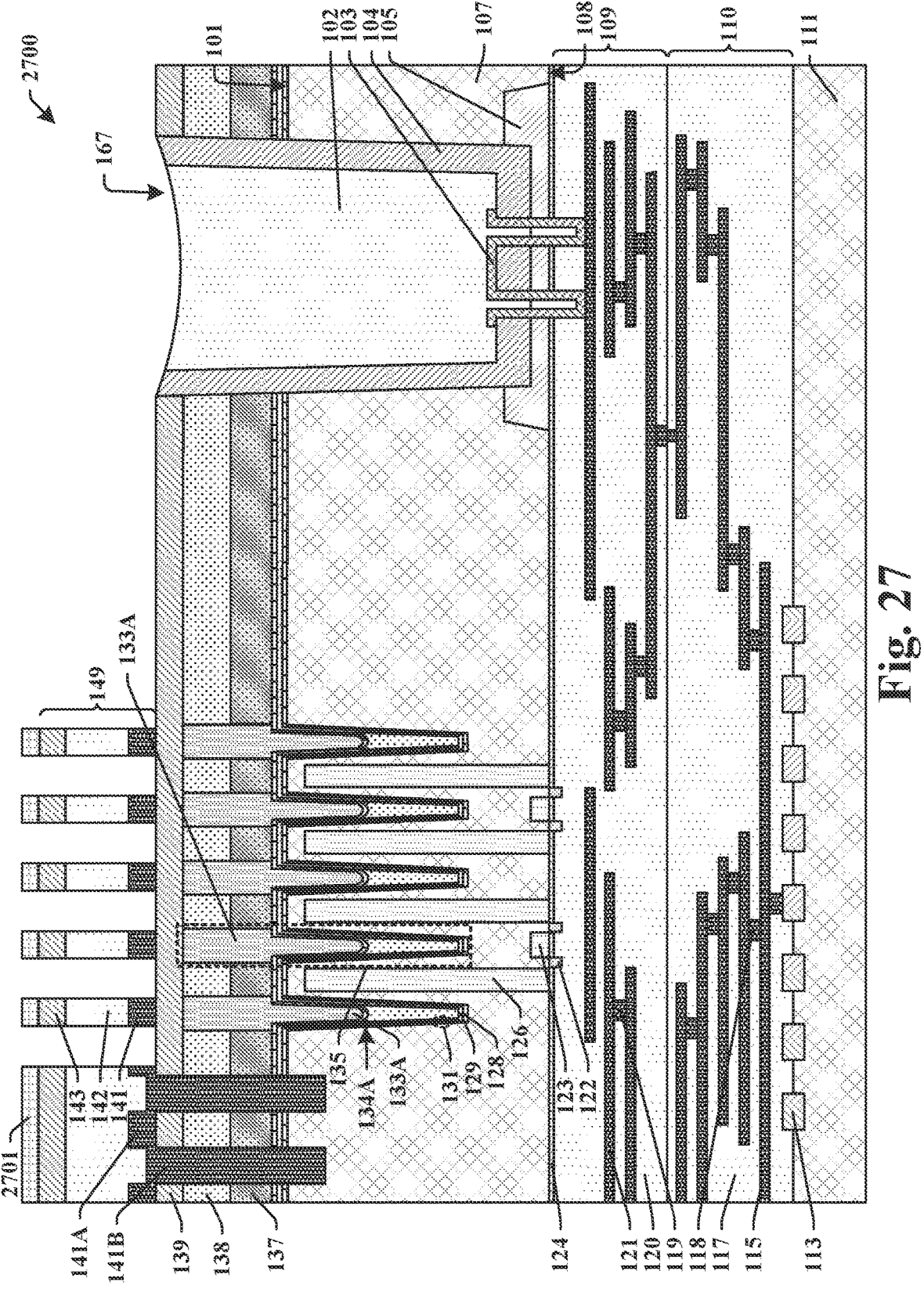

As shown by the cross-sectional view 2700 of FIG. 27, a mask 2701 may be formed and used to etch the composite grid 149 from the composite grid stack 2609. The etching removes the composite grid from over the photodetectors 126 and from over the pad dielectric 102. The etching forms the back side metal grid 141 from the metal layer 2601, the dielectric grid 142 from the dielectric layer 2603, and the hard mask grid 143 from the hard mask layer 2605. After the etching, the mask 2701 may be stripped.

Figure 28:
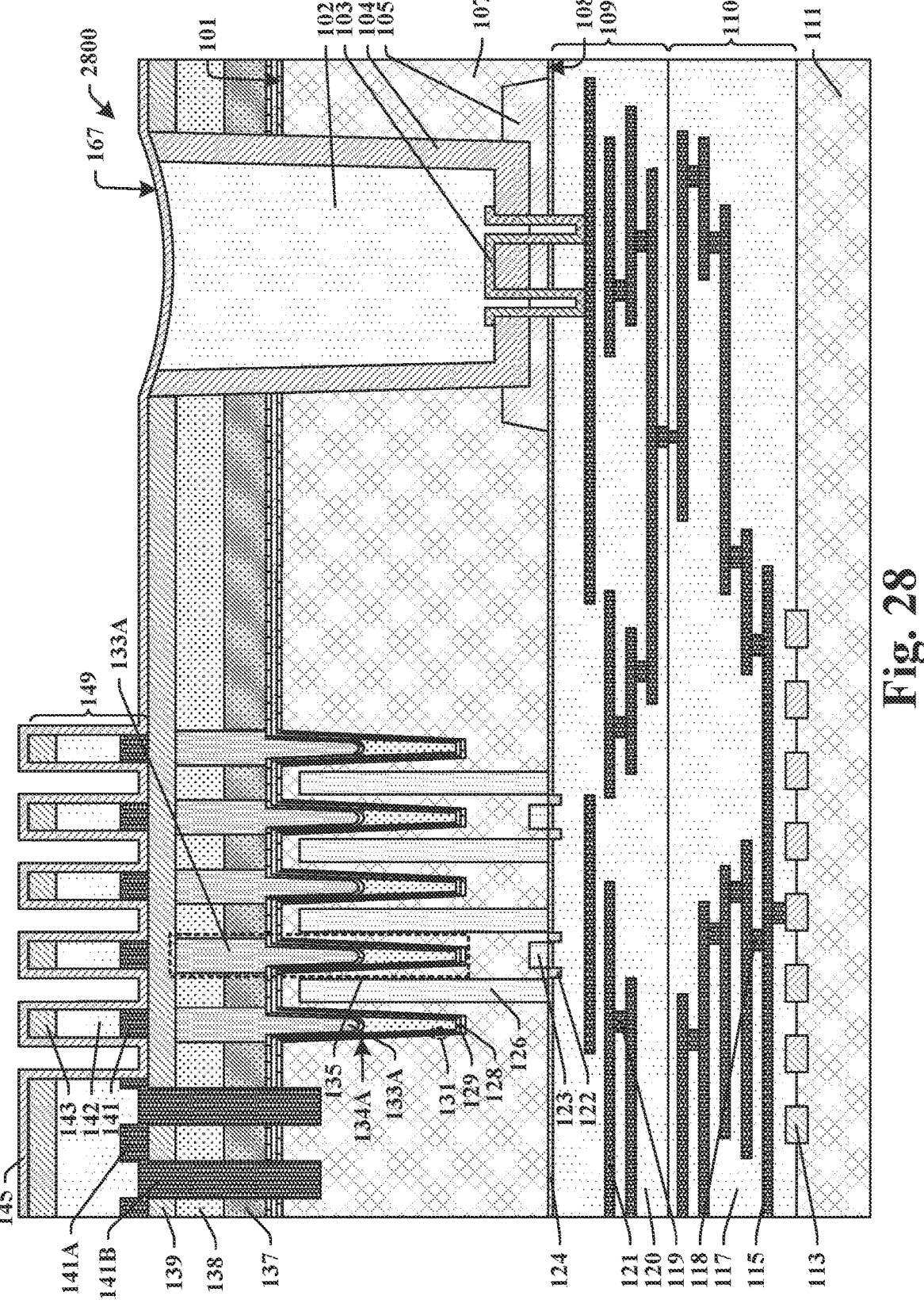
Figure 29:
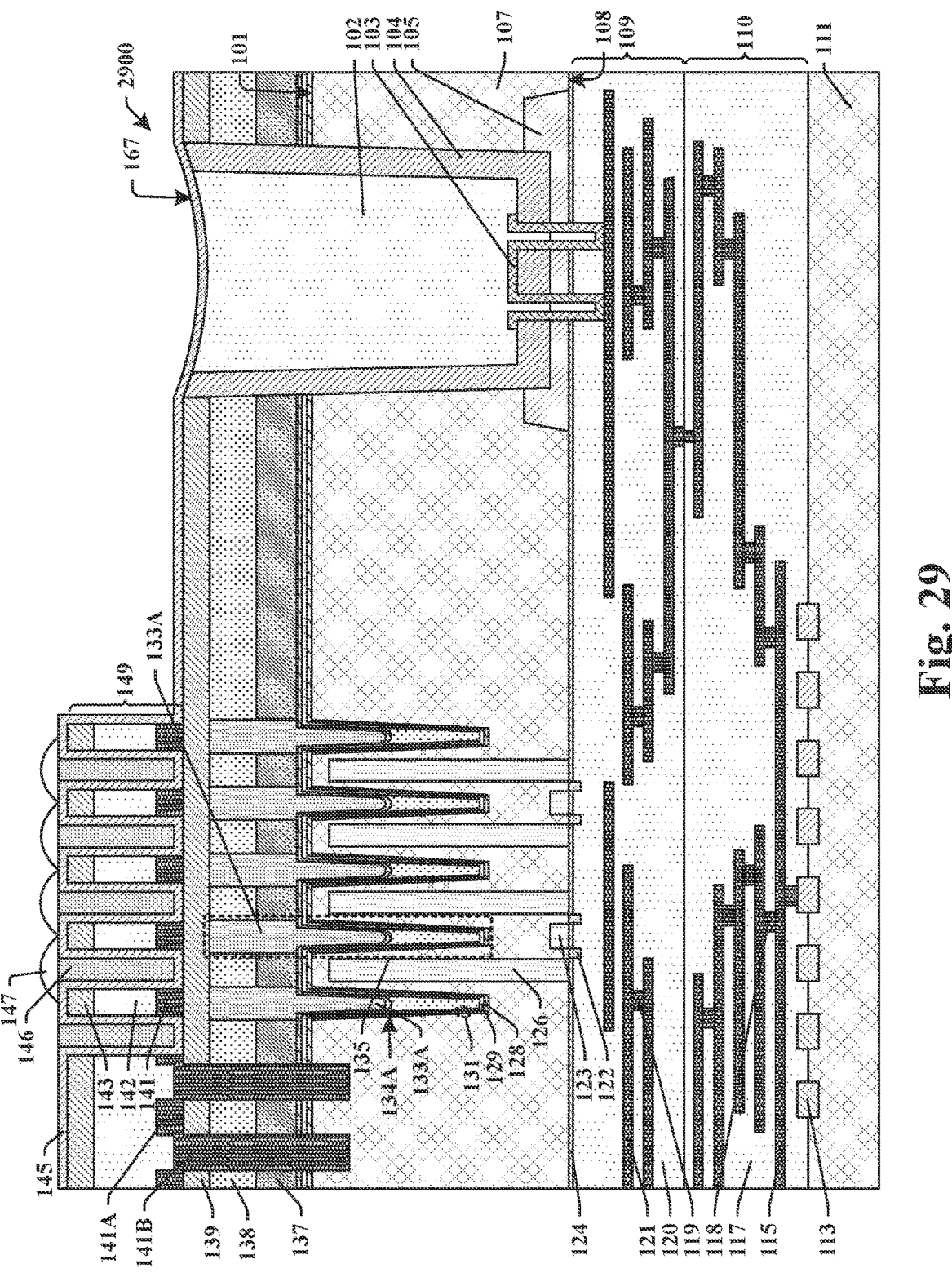

As shown by the cross-sectional view 2800 of FIG. 28, an encapsulation layer 145 may be formed over the structure illustrated by the cross-sectional view 2700 of FIG. 27. The encapsulation layer 145 conforms to the pad dielectric 102 and conforms to the concave surface 167. The encapsulation layer 145 may be an oxide, the like, or some other suitable dielectric. As shown by the cross-sectional view 2900 of FIG. 29, color filters 146 may be formed over the photodetectors 126 within the composite grid 149. Micro-lenses 147 may be formed over the color filters 146. An opening 165 may be etched through the encapsulation layer 145 and the pad dielectric 102 to expose the contact pad 103 and produce the structure of FIG. 1A.

FIG. 30 presents a flow chart for a process 3000 according to the present disclosure which may be used to form an IC device according to the present disclosure. While the process 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 3000 begins with act 3001, which is FEOL and BEOL processing. FEOL processing forms photodetectors in the first semiconductor substrate. BEOL processing forms a metal interconnect on the first semiconductor substrate. The IC device 701 of FIG. 7, provides an example of the resulting structure.

Act 3003 is bonding the first semiconductor substrate to a second semiconductor substrate. FIG. 7 illustrates this process. The process continues with act 3005, thinning the first semiconductor substrate from the back side. FIG. 8 provides an example of the resulting structure. The second IC device provides structural integrity through the thinning process.

Figure 9:
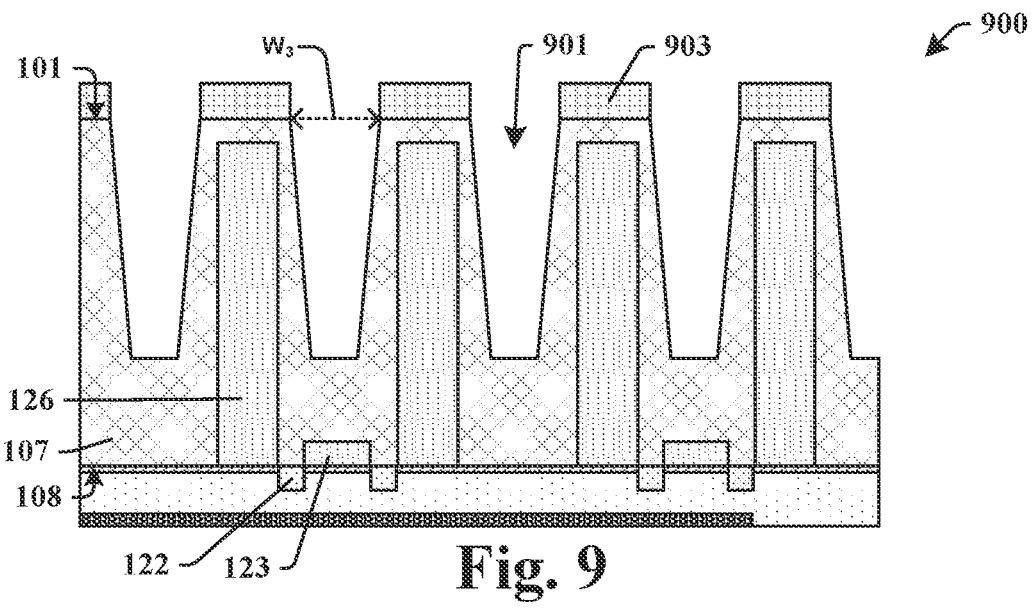

Act 3007 is etching trenches in the back side for a BDTI structure. The cross-sectional view 900 of FIG. 9 provides an example. The trenches extend into the semiconductor substrate in the image sensing area and may include one or more trenches that extends outside the image sensing area.

Act 3009 is depositing one or more dielectric layers to line the trenches. The cross-sectional view 1000 of FIG. 10 provides an example. The dielectric layers may be of the type that has fixed negative charges.

Acts 3011 and 3013 are optional steps that may be used to fill a lower portion of the trenches. Act 3011 is depositing the lower fill material. The cross-sectional view 1000 of FIG. 10 provides an example. Act 3013 is etching to cause the lower fill material to be recessed within the trenches. The cross-sectional view 1100 of FIG. 11 provides an example.

Act 3015 is depositing an etch stop layer. The etch stop layer is in some cases unnecessary in which case this step may be omitted. Act 3017 is depositing an intermediate passivation layer. Act 3019 is depositing an upper passivation layer. The cross-sectional view 1200 of FIG. 12 provides an example of the resulting structure.

Act 3021 is forming second trenches over the locations for the first trenches. The second trenches extend through the upper passivation layer, through the intermediate passivation layer, and into the first trenches. The cross-sectional view 1300 of FIG. 13 provides an example of the resulting structure.

Act 3023 is filling the second trenches with metal to form a substrate-embedded metal grid. The process may include depositing the metal followed by planarization. The cross-sectional views 1400 and 1500 of FIGS. 14 and 15 provide an example.

Act 3031 is forming a contact pad coupled to a front side conductive structure. The cross-sectional views 1700-2400 of FIGS. 17-24 provide an example.

Act 3033 is forming a composite grid, color filters, and lenses on the back side. The cross-sectional views 2500-2900 of FIGS. 25-29 provide an example.

Some aspects of the present disclosure relate to an image sensor that includes photodetectors within a semiconductor substrate, an upper passivation layer on the back side of the semiconductor substrate, and an intermediate passivation layer between the upper passivation layer and the back side. The intermediate passivation layer has a refractive index between that of the semiconductor substrate and that of the upper passivation layer. The back side isolation structure extends into the back side to laterally surround the photodetectors and includes a core. A dielectric liner separates the core from the semiconductor substrate. The core comprises a substrate-embedded metal grid that penetrates the intermediate passivation layer and extends into the semiconductor substrate.

In some embodiments the intermediate passivation layer comprises tantalum pentoxide ($Ta_2O_5$). In some embodiments the substrate-embedded metal grid undergoes a step-change in width at the base of the intermediate passivation layer or between the base of the intermediate passivation layer and the back side. In some embodiments there is an etch stop layer directly beneath and in direct contact with the intermediate passivation layer and beneath and in direct contact with the substrate-embedded metal grid. In some embodiments the core comprises a lower grid beneath the substrate-embedded metal grid. In some embodiments the lower grid and the substrate-embedded metal grid are separated by an etch stop layer. In some embodiments the dielectric liner is one or more layers of materials that exhibit fixed negative charges. In some embodiments the substrate-embedded metal grid penetrates the upper passivation layer. In some embodiments an upper part of the substrate-embedded metal grid extends through the upper passivation layer and forms a first grid, a lower part of the substrate-embedded metal grid is within the semiconductor substrate and forms a second grid, and the first grid is laterally offset with respect to the second grid. In some embodiments the intermediate passivation layer descends into the semiconductor substrate but not as deeply into the semiconductor substrate as the substrate-embedded metal grid. In some embodiments there is a space between two of the photodetectors in which the intermediate passivation layer descends into the semiconductor substrate on side of the core.

Some aspects of the present disclosure relate to an image sensor having photodetectors arrayed within the semiconductor substrate. A back side isolation structure extending into the semiconductor substrate between the photodetectors. The back side isolation structure includes a metal grid that is embedded within the semiconductor substrate and extends through the back side of the semiconductor substrate and a lower grid that is between the metal grid and the front side. In some embodiments the lower grid is non-metal. In some embodiments the metal grid cuts a the passivation layer that is on the back side.

Some aspects of the present disclosure relate to a method that includes providing a semiconductor substrate with a peripheral area and photodetectors in an array within an image sensing area. First trenches are formed in the back side of the semiconductor substrate in a pattern of a grid having segments between the photodetectors. The first trenches are lined with dielectric, semiconductor substrate. A first passivation layer and a second passivation layer are deposited on the back side. Second trenches are etched. The second trenches extend through the second passivation layer, through the first passivation layer, and through the back side into areas of the first trenches. The second trenches are filled with metal.

In some embodiments the method further includes depositing an etch stop layer on the back side after lining the first trenches with dielectric and before depositing the first passivation layer. The second trenches stop on the etch stop layer. In some embodiments the method further includes depositing a lower fill material into the first trenches after lining the first trenches with dielectric and etching to recess the lower fill material within the first trenches before depositing the etch stop layer. In some embodiments the second trenches have the pattern of the grid but a smaller width than the first trenches. In some embodiments the forming the first trenches comprises using a reticle to photolithographically pattern a first mask and forming the second trenches comprises using the same reticle to photolithographically pattern a second mask. In some embodiments the first trenches and the second trenches tough both formed using one reticle have different widths.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a semiconductor substrate including a front side, a back side, an image sensing area, a peripheral area, and photodetectors in an array within the image sensing area;
   forming first trenches in the back side in a pattern of a grid having segments between the photodetectors;
   lining the first trenches with dielectric;

after lining the first trenches with dielectric, depositing an etch stop layer on the back side;

depositing a first passivation layer over the etch stop layer on the back side;

depositing a second passivation layer over the first passivation layer on the back side;

etching second trenches, wherein the second trenches extend through the second passivation layer, through the first passivation layer, through the back side into areas of the first trenches, and stops on the etch stop layer; and filling the second trenches with metal.

2. The method of claim 1, further comprising:

depositing a lower fill material into the first trenches after lining the first trenches with dielectric; and etching to recess the lower fill material within the first trenches before depositing the etch stop layer.

3. The method of claim 1, wherein the second trenches have the pattern of the grid but a smaller width than the first trenches.

4. The method of claim 1, wherein:

forming the first trenches comprises using a reticle to photolithographically pattern a first mask; and forming the second trenches comprises using the reticle to photolithographically pattern a second mask.

5. The method of claim 4, wherein the first trenches and the second trenches have different widths.

6. The method of claim 1, wherein filling the second trenches with the metal forms a substrate-embedded metal grid, and the method further comprises forming a back side metal grid over the substrate-embedded metal grid.

7. A method comprising:

providing a semiconductor substrate including a first side and a second side;

forming photodiodes by a process that includes doping the semiconductor substrate through the first side;

forming a back-end-of-line metal interconnect structure on the first side;

bonding the semiconductor substrate to a second substrate;

thinning the semiconductor substrate from the second side;

etching first trenches in the second side, wherein the first trenches are in a first grid pattern and extend into the semiconductor substrate between the photodiodes, and the first trenches are defined by inner sidewalls of the semiconductor substrate;

lining the first trenches with a first dielectric structure;

depositing a second dielectric structure, wherein the second dielectric structure closes off the first trenches;

etching to recess the second dielectric structure within the first trenches;

depositing a third dielectric structure in the first trenches;

after depositing the third dielectric structure, etching second trenches in a second grid pattern, wherein the second grid pattern is aligned with the first grid pattern, and the second trenches extend into the first trenches; and depositing a metal in the second trenches.

8. The method of claim 7, wherein the first dielectric structure comprises a high-k dielectric layer, and the second dielectric structure comprises silicon dioxide.

9. The method of claim 7, wherein depositing the third dielectric structure comprises sequentially depositing an additional dielectric layer and a silicon dioxide layer, wherein the additional dielectric layer has a refractive index intermediate between that of silicon dioxide and that of the semiconductor substrate.

10. The method of claim 9, wherein the first additional dielectric layer comprises tantalum pentoxide.

11. The method of claim 7, wherein etching to recess the second dielectric structure within the first trenches removes the second dielectric structure from above the first dielectric structure on the second side.

12. The method of claim 7, wherein etching to recess the second dielectric structure comprises a wet etch process.

13. The method of claim 7, wherein etching to recess the second dielectric structure restricts the second dielectric structure to a lower half of the first trenches.

14. The method of claim 7, further comprising, after etching to recess the second dielectric structure and before depositing the third dielectric structure in the first trenches, depositing an etch stop layer in the first trenches.

15. The method of claim 7, wherein etching the second trenches comprises anisotropic plasma etching.

16. The method of claim 7, wherein:

etching the first trenches in a first grid pattern comprises using a reticle in a first photolithographic process to pattern a first mask; and etching the second trenches in a second grid pattern comprises using the reticle in a second photolithographic process to pattern a second mask.

17. The method of claim 7, wherein the metal forms a substrate-embedded metal grid, and the method further comprises forming a back side metal grid over the substrate-embedded metal grid.

18. The method of claim 7, wherein the third dielectric structure comprises an etch stop layer and a passivation layer over the etch stop layer, and etching the second trenches in the second grid pattern is etching that stops on the etch stop layer.

19. A method comprising:

providing a semiconductor substrate including a first side and a second side;

forming photodiodes by a process that includes doping the semiconductor substrate through the first side;

forming a back-end-of-line metal interconnect structure on the first side;

bonding the semiconductor substrate to a second substrate;

thinning the semiconductor substrate from the second side;

etching first trenches in the second side, wherein the first trenches are defined by inner sidewalls of the semiconductor substrate;

using a conformal deposition process to deposit one or more high-k dielectric layers on the inner sidewalls;

filling the first trenches with an oxide;

etching to remove the oxide from an upper portion of the first trenches;

filling the first trenches by depositing one or more additional dielectric layers;

etching second trenches, wherein the second trenches extend through the one or more additional dielectric layers and into the first trenches; and depositing metal in the second trenches.

20. The method of claim 19, further comprising forming a back side metal grid, wherein the back side metal grid is grounded to the semiconductor substrate.

* * * * *